(12) United States Patent
Kim et al.

(10) Patent No.: US 10,840,409 B2
(45) Date of Patent: Nov. 17, 2020

(54) LIGHT EMITTING DIODE

(71) Applicant: SEOUL VIOSYS CO., LTD., Ansan-si (KR)

(72) Inventors: Ji Hye Kim, Ansan-si (KR); Kyoung Wan Kim, Ansan-si (KR); Ye Seul Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 42 days.

(21) Appl. No.: 16/264,866

(22) Filed: Feb. 1, 2019

(65) Prior Publication Data

US 2019/0165208 A1 May 30, 2019

Related U.S. Application Data

(63) Continuation of application No. PCT/KR2017/008337, filed on Aug. 2, 2017.

(30) Foreign Application Priority Data

Aug. 5, 2016 (KR) .................. 10-2016-0099996
Aug. 1, 2017 (KR) .................. 10-2017-0097775

(51) Int. Cl.
| | |
|---|---|
| H01L 33/14 | (2010.01) |
| H01L 33/32 | (2010.01) |
| H01L 33/62 | (2010.01) |
| H01L 33/20 | (2010.01) |
| H01L 33/38 | (2010.01) |
| H01L 33/46 | (2010.01) |
| G02F 1/13357 | (2006.01) |
| F21Y 115/10 | (2016.01) |
| F21K 9/23 | (2016.01) |

(Continued)

(52) U.S. Cl.
CPC ............ *H01L 33/145* (2013.01); *H01L 33/20* (2013.01); *H01L 33/32* (2013.01); *H01L 33/38* (2013.01); *H01L 33/46* (2013.01); *H01L 33/62* (2013.01); *F21K 9/23* (2016.08); *F21S 41/143* (2018.01); *F21Y 2115/10* (2016.08); *G02B 6/009* (2013.01); *G02B 6/0021* (2013.01); *G02B 6/0073* (2013.01); *G02F 1/133603* (2013.01)

(58) Field of Classification Search
CPC ...................................................... H01L 33/145
See application file for complete search history.

(56) References Cited

U.S. PATENT DOCUMENTS

| | | | | |
|---|---|---|---|---|
| 2008/0217635 | A1* | 9/2008 | Emerson | H01L 33/145 |
| | | | | 257/98 |
| 2017/0179343 | A1* | 6/2017 | Chou | H01L 33/38 |

FOREIGN PATENT DOCUMENTS

| | | |
|---|---|---|
| JP | 2008-210900 | 9/2008 |
| JP | 2016-100510 | 5/2016 |

(Continued)

OTHER PUBLICATIONS

International Search Report dated Nov. 8, 2017, issued in International Application No. PCT/KR2017/008337 (with English Translation).

*Primary Examiner* — Charles D Garber
(74) *Attorney, Agent, or Firm* — H.C. Park & Associates, PLC

(57) ABSTRACT

A light emitting diode includes a current blocking layer interposed between a first connection pad and a first conductivity type semiconductor layer to improve efficiency in spreading of electric current supplied to the first conductivity type semiconductor layer.

20 Claims, 23 Drawing Sheets

(51) Int. Cl.
*F21V 8/00* (2006.01)
*F21S 41/143* (2018.01)

(56) References Cited

FOREIGN PATENT DOCUMENTS

| | | |
|---|---|---|
| KR | 10-2015-0097990 | 8/2015 |
| KR | 10-2016-0041142 | 4/2016 |
| KR | 10-2016-0081392 | 7/2016 |

* cited by examiner

LIGHT EMITTING DIODE

CROSS REFERENCE TO RELATED APPLICATIONS

This application is a Bypass Continuation of International Patent Application No. PCT/KR2017/008337, filed on Aug. 2, 2017, and claims priority to and the benefit of Korean Patent Application Nos. 10-2016-0099996, filed on Aug. 5, 2016, and 10-2017-0097775, filed on Aug. 1, 2017, which are hereby incorporated by reference for all purposes as if fully set forth herein.

BACKGROUND

Field

Exemplary embodiments/implementations of the invention relate generally to a light emitting diode and, more specifically, to a light emitting diode having improved current dispersion capability.

Discussion of the Background

A light emitting diode (LED) refers to a semiconductor device that generates a small number of carriers (electrons or holes) injected through a p-n junction structure thereof and emits light through recombination of the carriers, and can realize various colors by constituting light emitting sources through change of materials for compound semiconductors, such as GaAs, AlGaAs, GaN, InGaN, AlGaInP, and the like.

Such a light emitting diode has lower power consumption and longer lifespan than typical electric bulbs or fluorescent lamps, can be installed in a narrow space, and is invulnerable to vibration. Such a light emitting diode is used in display devices and backlight units and has expanded its application range to large LCD-TV backlights, vehicular headlamps, and general lighting in view of reduction in power consumption and high durability. Therefore, there is a need for improvement in luminous efficacy of the light emitting diode.

The above information disclosed in this Background section is only for understanding of the background of the inventive concepts, and, therefore, it may contain information that does not constitute prior art.

SUMMARY

Devices constructed according to exemplary embodiments of the invention are capable of providing a light emitting diode having improved current dispersion capability.

Exemplary embodiments of the present disclosure provide a light emitting diode that can minimize current crowding in a contact region between a connection pad and a nitride semiconductor stack.

Exemplary embodiments of the present disclosure provide a light emitting diode that has improved reliability.

Exemplary embodiments of the present disclosure provide a light emitting diode that can reduce or prevent light loss due to absorption of light by a connection pad in a contact region between the connection pad and a nitride semiconductor stack.

Additional features of the inventive concepts will be set forth in the description which follows, and in part will be apparent from the description, or may be learned by practice of the inventive concepts.

In accordance with one exemplary embodiment of the present disclosure, a light emitting diode includes: a nitride semiconductor stack including a first conductivity type semiconductor layer, a second conductivity type semiconductor layer and an active layer interposed between the first and second conductivity type semiconductor layers, and having an exposed region formed through the second conductivity type semiconductor layer and the active layer to expose the first conductivity type semiconductor layer; a first connection pad electrically connected to the first conductivity type semiconductor layer through the exposed region; a first current blocking layer interposed between the first conductivity type semiconductor layer and the first connection pad; a second connection pad disposed on the second conductivity type semiconductor layer; and at least two upper extensions extending from the second connection pad, wherein the first connection pad is disposed between the upper extensions and the first current blocking layer is partially placed in a region between the first conductivity type semiconductor layer and the first connection pad.

In accordance with another exemplary embodiment of the present disclosure, a light emitting diode includes: a semiconductor stack including a first conductivity type semiconductor layer, an active layer and a second conductivity type semiconductor layer, and having an exposed region formed through the second conductivity type semiconductor layer and the active layer to expose the first conductivity type semiconductor layer; a first connection pad connected to the first conductivity type semiconductor layer through the exposed region; a lower extension extending from the first connection pad; and a first current blocking layer interposed between the first connection pad and the first conductivity type semiconductor layer, wherein the first connection pad includes a first curved region having a radius of curvature of $R_1$; the first current blocking layer includes a second curved region having a radius of curvature of $R_2$, the second curved region being disposed adjacent to an inner side of the first curved region, the lower extension includes a connecting portion adjoining the first connection pad and a main extension extending from the connecting portion, the connecting portion including a third curved region having a radius of curvature of $R_3$, $R_2$ being greater than $R_3$ and less than $R_1$.

In a light emitting diode according to exemplary embodiments of the present disclosure, a current blocking layer is disposed between a connection pad and a first conductivity type semiconductor layer to allow uniform current spreading in the first conductivity type semiconductor layer. In addition, the current blocking layer has high reflectance to improve light extraction efficiency of the light emitting diode. Further, each of the connection pad and the current blocking layer includes a curved region to improve reliability and to guide current flow to a lower extension connected to the connection pad, thereby improving light output of the light emitting diode.

Additional features of the inventive concepts will be set forth in the description which follows, and in part will be apparent from the description, or may be learned by practice of the inventive concepts.

BRIEF DESCRIPTION OF DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
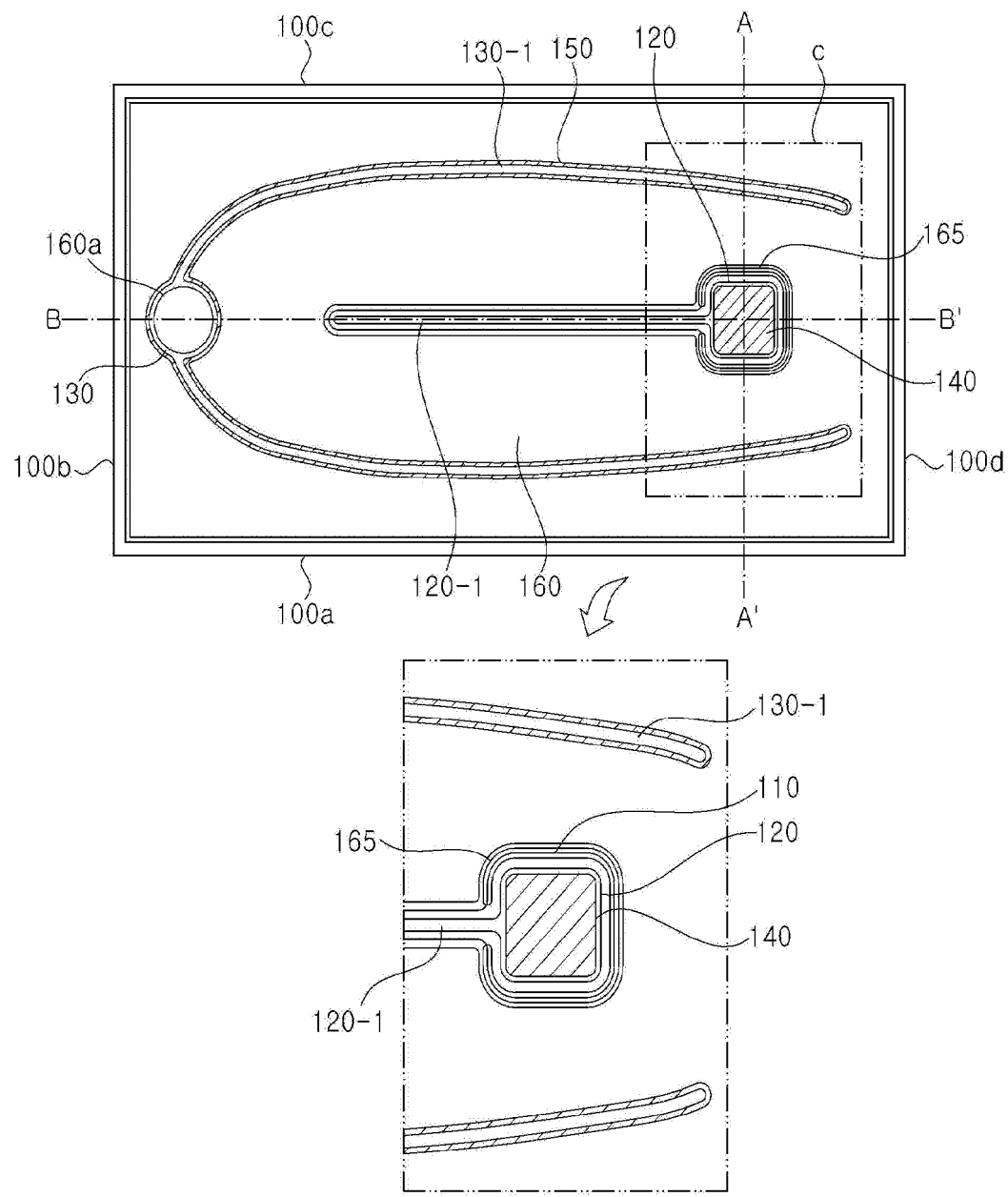
FIG. 1 is a plan view of a light emitting diode according to one exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

One exemplary embodiment of the present disclosure provides a light emitting diode. The light emitting diode includes: a nitride semiconductor stack including a first conductivity type semiconductor layer, a second conductivity type semiconductor layer and an active layer interposed between the first and second conductivity type semiconductor layers, and having an exposed region formed through the second conductivity type semiconductor layer and the active layer to expose the first conductivity type semiconductor layer; a first connection pad electrically connected to the first conductivity type semiconductor layer through the exposed region; a first current blocking layer interposed between the first conductivity type semiconductor layer and the first connection pad; a second connection pad disposed on the second conductivity type semiconductor layer; and upper extensions extending from the second connection pad. At least two upper extensions are provided; the first connection pad is disposed between the upper extensions; and the first current blocking layer is partially interposed in some region between the first conductivity type semiconductor layer and the first connection pad to improve current spreading efficiency.

A region of the first current blocking layer may not exceed 90% of a region between the first conductivity type semiconductor layer and the first connection pad.

The first current blocking layer may include a $SiO_2$ layer or a distributed Bragg reflector.

The distributed Bragg reflector may have a structure in which $SiO_2$ layers and $TiO_2$ layers or $SiO_2$ layers and $Nb_2O_5$ layers are alternately stacked one above another.

The first current blocking layer may have the same shape as the first connection pad.

The light emitting diode may further include a second current blocking layer disposed under the second connection pad and the plural upper extensions.

The second current blocking layer may include the same material layer as the first current blocking layer.

The current blocking layer disposed under the second connection pad may have a width greater than or equal to a width of the second connection pad, and the current blocking layer disposed under the plural upper extensions may have a width greater than or equal to widths of the plural upper extensions.

The light emitting diode may further include a lower extension extending from the first connection pad and contacting the first conductivity type semiconductor layer.

The light emitting diode may further include an ohmic electrode layer disposed on the second conductivity type semiconductor layer and forming ohmic contact with the second conductivity type semiconductor layer.

The ohmic electrode layer may include a transparent electrode layer or a metal electrode layer.

The light emitting diode may further include an insulation layer covering the nitride semiconductor stack exposed through the exposed region.

The insulation layer may include a $SiO_2$ layer or a distributed Bragg reflector.

The insulation layer may be formed by the same process as the first current blocking layer.

The nitride semiconductor stack may include a plurality of exposed regions, wherein the exposed regions may include a first exposed region including at least one first hole and at least one second hole, and a second exposed region including at least one third hole.

The at least one first hole and the at least one second hole may have a circular or polygonal shape in plan view, and the at least one third hole may have a shape extending from the at least one second hole in a certain direction.

The first connection pad may adjoin the first conductivity type semiconductor layer through the first exposed region and the lower extension may adjoin the second conductivity type semiconductor layer through the second exposed region.

The first current blocking layer may be interposed in some region between the first conductivity type semiconductor layer and the first connection pad to be restrictively placed in the first exposed region.

The third hole may have a smaller width than the first hole and the second hole.

The light emitting diode may further include a first bonding pad electrically connected to the first connection pad and a second bonding pad electrically connected to the second connection pad.

The first bonding pad and the second bonding pad may be electrically insulated from each other.

The light emitting diode may further include an insulation layer interposed between each of the first bonding pad and the second bonding pad and the nitride semiconductor stack.

The first bonding pad and the second bonding pad may be electrically connected to the first connection pad and the second connection pad through holes formed in the insulation layer, respectively.

Another exemplary embodiment of the present disclosure provides a light emitting diode. The light emitting diode includes: a semiconductor stack including a first conductivity type semiconductor layer, an active layer and a second conductivity type semiconductor layer, and having an exposed region formed through the second conductivity type semiconductor layer and the active layer to expose the first conductivity type semiconductor layer; a first connection pad connected to the first conductivity type semiconductor layer through the exposed region and a lower extension extending from the first connection pad; and a first current blocking layer interposed between the first connection pad and the first conductivity type semiconductor layer, wherein the first connection pad includes a first curved region having a radius of curvature of $R_1$, the first current blocking layer includes a second curved region having a radius of curvature of $R_2$, the second curved region being disposed adjacent to an inner side of the first curved region, and the lower extension includes a connecting portion adjoining the first connection pad and a main extension extending from the connecting portion, the connecting portion including a third curved region having a radius of curvature of $R_3$, $R_2$ being greater than $R_3$ and less than $R_1$.

The first curved region and the second curved region may have the same center and the second curved region may be disposed within a region defined by the first curved region and imaginary straight lines connecting both ends of the first curved region to the center of the first and second curved regions. Here, a gap between the first curved region and the second curved region may be kept uniform. As a result, electric current supplied through the first connection pad can be uniformly spread.

A width of the connecting portion of the lower extension may be greater than the gap between the first curved region and the second curved region and gradually decrease with increasing distance from the first connection pad. In addition, the main extension may have a width that is greater than or equal to the gap between the first curved region and the second curved region.

The first current blocking layer may be restrictively interposed in some region between the first conductivity type semiconductor layer and the first connection pad to improve current spreading efficiency. For example, an area of the first current blocking layer may not exceed 90% of an area of a region between the first conductivity type semiconductor layer and the first connection pad. With this structure, the light emitting diode allows efficient current spreading without increase in forward voltage.

The first current blocking layer may be composed of a single layer or a distributed Bragg reflector. Here, the distributed Bragg reflector may have a structure in which $SiO_2$ layers and $TiO_2$ layers or $SiO_2$ layers and $Nb_2O_5$ layers are alternately stacked one above another.

The light emitting diode may further include a third current blocking layer disposed under the lower extension, wherein the third current blocking layer may include a plurality of dots separated from each other.

The third current blocking layer may have a greater width than the main extension. Here, the main extension may be connected to the first conductivity type semiconductor layer in a region between the dots. That is, the main extension may be discontinuously connected to the first conductivity type semiconductor layer by the third current blocking layer.

The light emitting diode may further include a second connection pad disposed on the second conductivity type semiconductor layer and an upper extension extending from the second connection pad.

The light emitting diode may further include an ohmic electrode layer disposed on the second conductivity type semiconductor layer to form ohmic contact with the second conductivity type semiconductor layer, and the second connection pad and the upper extension may be disposed on the ohmic electrode layer.

Hereinafter, exemplary embodiments of the present disclosure will be described in detail with reference to the accompanying drawings.

Figure 2:
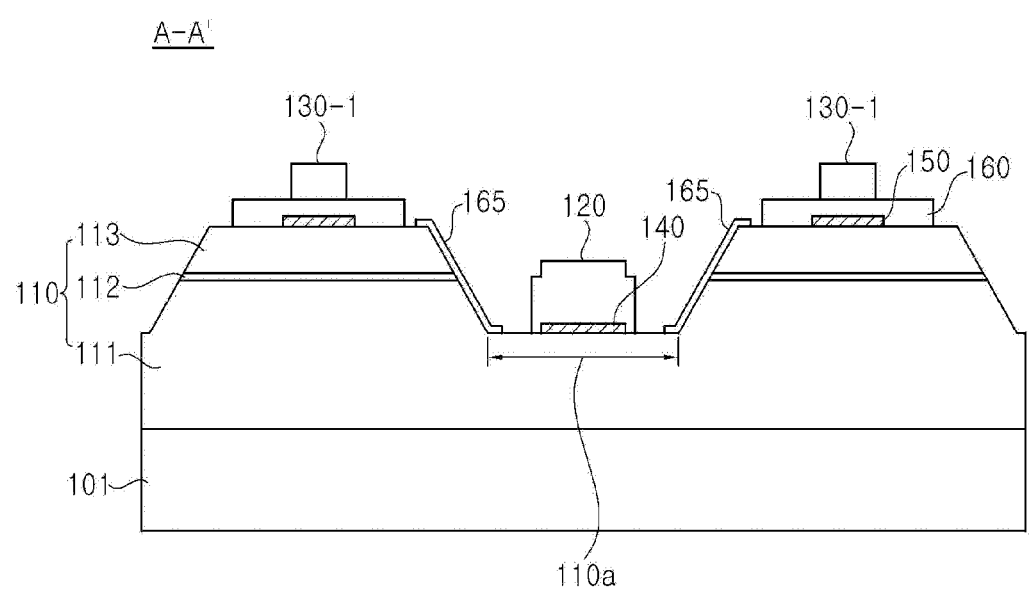
FIG. 2 is a cross-sectional view taken along line A-A' of FIG. 1.
Figure 3:
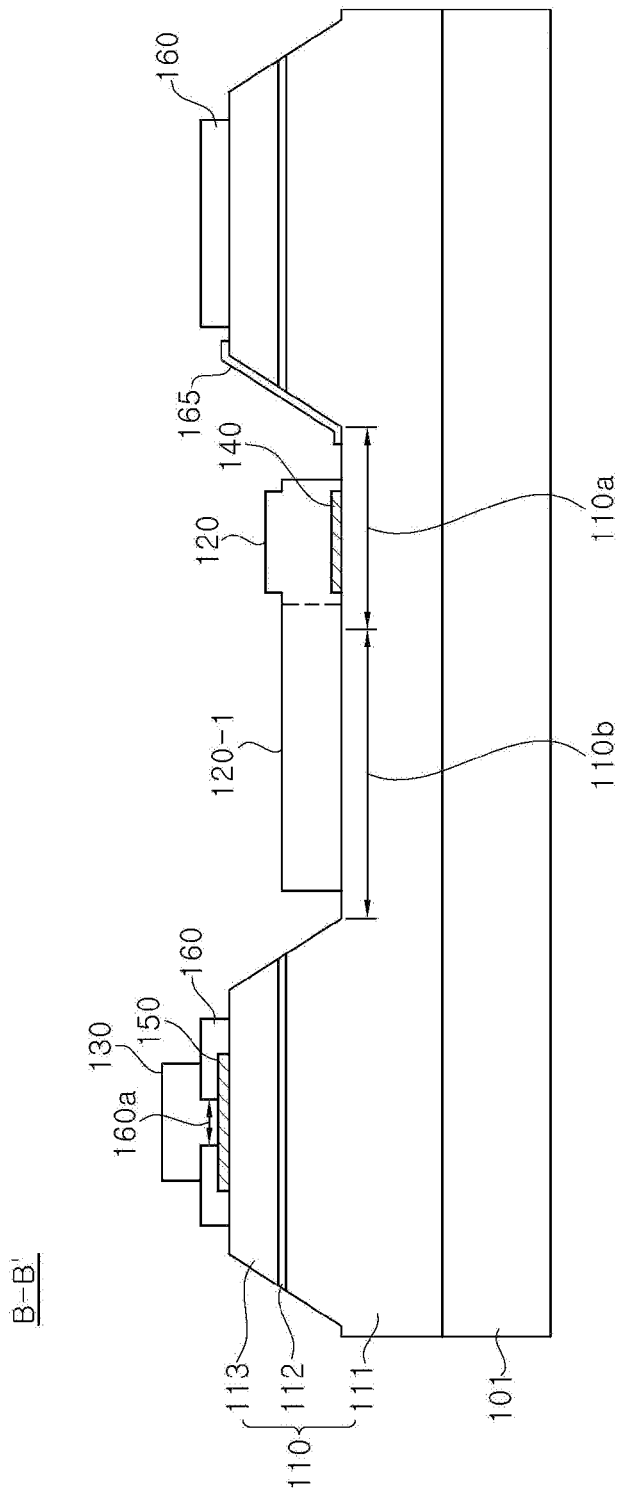
FIG. 3 is a cross-sectional view taken along line B-B' of FIG. 1.

FIG. 1 is a plan view and FIG. 2 and FIG. 3 are cross-sectional views of a light emitting diode according to one exemplary embodiment of the present disclosure. Specifically, FIG. 1 is a plan view of the light emitting diode according to this exemplary embodiment, FIG. 2 is a cross-sectional view taken along line A-A' of FIG. 1, and FIG. 3 is a cross-sectional view taken along line B-B' of FIG. 1.

Referring to FIG. 1 to FIG. 3, the light emitting diode includes a nitride semiconductor stack 110, a first connection pad 120, a second connection pad 130, a first current blocking layer 140, and a second current blocking layer 150. In addition, the light emitting diode may further include a lower extension 120-1 extending from the first connection pad 120 in a certain direction and an upper extension 130-1 extending from the second connection pad 130 in a certain direction. The lower extension 120-1 may be provided singularly or in plural and may extend from the first connection pad 120 in a certain direction, and a width of the lower extension 120-1 may be smaller than or equal to a width of the first connection pad 120. The upper extension 130-1 may be provided singularly or in plural and may extend from the second connection pad 130 in a certain direction, and a width of the upper extension 130-1 may be smaller than or equal to a width of the second connection pad 130. In particular, the upper extension 130-1 may be composed of two upper extensions formed to surround the first connection pad 120. Although two upper extensions 130-1 are illustrated in this exemplary embodiment, it should be understood that the light emitting diode may include a greater number of upper extensions.

The light emitting diode may further include a transparent electrode layer 160 disposed on the nitride semiconductor stack 110 and a substrate 101. In addition, the light emitting diode may further include an insulation layer 165 covering a side surface of the semiconductor stack. In addition, the light emitting diode may have a polygonal shape in plan view. In particular, the light emitting diode may have a rectangular shape in plan view. According to this exemplary embodiment, the light emitting diode may have a substantially square shape in plan view, and may include a first side surface 100*a*, a second side surface 100*b*, a third side surface 100*c* opposite the first side surface 100*a*, and a fourth side surface 100*d* opposite the second side surface 100*b*. Referring to FIG. 1, the lower extension 120-1 may be formed to extend from the first connection pad 120 in a shape extending from the fourth side surface 100*d* towards the second side surface 100*b*. In addition, the upper extensions 130-1 may be formed to extend the second connection pad 130 in a shape extending from the second side surface 100*b* toward the fourth side surface 100*d* in a curved shape. However, it should be understood that the present disclosure is not limited thereto.

The nitride semiconductor stack 110 includes a first conductivity type semiconductor layer 111 disposed on the substrate 101, an active layer 112 disposed on the first conductivity type semiconductor layer 111, and a second conductivity type semiconductor layer 113 disposed on the active layer 112. Further, the nitride semiconductor stack 110 may include exposed regions 110*a*, 110*b* that partially expose the first conductivity type semiconductor layer 111.

In the exposed regions 110a, 110b, the nitride semiconductor stack 110 may have a mesa structure. Current spreading efficiency and a light emitting pattern of the light emitting diode may be determined depending upon the number, locations, and shapes of the exposed regions 110a, 110b. In particular, referring to FIG. 1 and FIG. 3, the exposed regions 110a, 110b may be surrounded by nitride semiconductor layers and may be spaced apart from an edge of the nitride semiconductor stack 110. In particular, the exposed region 110a may be spaced apart from the fourth side surface 100d of the light emitting diode. In addition, the exposed region 110a may be disposed between the upper extensions 130-1 and be spaced apart from the fourth side surface 100d of the light emitting diode.

Although not shown in the drawings, the light emitting diode according to the exemplary embodiment may include a structure in which the upper extensions 130-1 extend to a region between the fourth side surface 100d and the exposed region 110a. That is, the light emitting diode may include a structure in which the upper extensions 130-1 surround the exposed region 110a.

The substrate 101 may be formed of a well-known material, such as $Al_2O_3$, SiC, Si, GaAs, GaN, ZnO, GaP, InP, Ge, and the like. Although not shown in the drawings, roughness patterns may be formed on upper and/lower surfaces of the substrate 101. The roughness patterns of the substrate 101 may be arbitrarily selected from among stripe shapes, lens shapes, columnar shapes, conical shapes, and the like.

The first conductivity type semiconductor layer 111 is a semiconductor layer doped with a first conductivity type dopant. The first conductivity type semiconductor layer 111 may be formed of at least one of GaN, InN, AlN, InGaN, AlGaN, and InAlGaN. If the first conductivity type semiconductor layer 111 is an n-type semiconductor layer, the first conductivity type dopant may include at least one n-type dopant selected from among Si, Ge, Sn, Se, and Te.

The active layer 112 may have a single quantum well structure or a multi-quantum well (MQW) structure. That is, the active layer 112 may be formed of at least one Group III-V compound semiconductor material of GaN, InN, AlN, InGaN, AlGaN, and InAlGaN. For example, the active layer 112 may have a structure in which InGaN well layers and GaN barrier layers are alternately stacked one above another. The active layer 112 generates light through recombination of carriers supplied from the first conductivity type semiconductor layer 111 and carriers supplied from the second conductivity type semiconductor layer 113. If the first conductivity type semiconductor layer 111 is an n-type semiconductor layer, the carriers supplied from the first conductivity type semiconductor layer 111 may be electrons, and if the second conductivity type semiconductor layer 113 is a p-type semiconductor layer, the carriers supplied from the second conductivity type semiconductor layer 113 may be holes.

The second conductivity type semiconductor layer 113 may include a semiconductor layer doped with a second conductivity type dopant and may be composed of a single layer or multiple layers. The second conductivity type semiconductor layer 113 may be formed of at least one of GaN, InN, AlN, InGaN, AlGaN, and InAlGaN. If the second conductivity type semiconductor layer 113 is a p-type semiconductor layer, the second conductivity type dopant may include at least one p-type dopant selected from among Mg, Zn, Ca, Sr, and Ba.

The light emitting diode according to the exemplary embodiment may further include an undoped layer or other buffer layers in order to improve crystal quality in addition to the first conductivity type semiconductor layer 111, the active layer 112 and the second conductivity type semiconductor layer 113, and if the second conductivity type semiconductor layer 113 is a p-type semiconductor layer, the light emitting diode may include various functional layers, such as a current blocking layer (not shown) interposed between the active layer 112 and the second conductivity type semiconductor layer 113.

Referring to FIG. 1 to FIG. 3, the nitride semiconductor stack 110 may include the exposed regions 110a, 110b. The exposed regions 110a, 110b may partially expose the first conductivity type semiconductor layer 111. The exposed regions 110a, 110b may be formed by photolithography and etching. For example, the exposed regions 110a, 110b may be formed by defining an etching region using a photoresist, followed by etching the second conductivity type semiconductor layer 113 and the active layer 112 through dry etching such as ICP. In addition, during formation of the exposed regions 110a, 110b, the first conductivity type semiconductor layer 111 may be partially removed by etching. The exposed region 110a may have a substantially circular shape or a polygonal shape. The exposed region 110b may extend from the exposed region 110a in a certain direction. Here, the exposed region 110b may be connected to the exposed region 110a. Further, a width of the exposed region 110b may be smaller than or equal to a width of the exposed region 110a. Current spreading efficiency and a light emitting pattern of the light emitting diode may be determined depending upon the number, locations, and shapes of the exposed regions 110a, 110b. Referring to FIG. 1, the exposed region 110a may be spaced apart from the fourth side surface 100d of the light emitting diode. The nitride semiconductor stack 110 may be interposed between the exposed region 110a and the fourth side surface 100d. In addition, the exposed region 110b may extend from the exposed region 110a in a shape extending from the fourth side surface 100d toward the second side surface 100b. Here, it should be understood that the number, locations, and shapes of the exposed regions 110a, 110b are not limited to those illustrated in FIG. 1 and may be changed in various ways within the scope of the present disclosure.

The first connection pad 120 and the lower extension 120-1 may be electrically connected to the first conductivity type semiconductor layer 111, and particularly, may form ohmic contact with the first conductivity type semiconductor layer 111. The first connection pad 120 and the lower extension 120-1 may cover a portion of the nitride semiconductor stack 110. The first connection pad 120 and the lower extension 120-1 may be electrically connected to the first conductivity type semiconductor layer 111 through the exposed regions 110a, 110b. Accordingly, portions of the first connection pad 120 and the lower extension 120-1, through which electric current is supplied to the nitride semiconductor stack 110, may be controlled depending upon the locations and shapes of the exposed regions 110a, 110b. The exposed region 110b and the exposed region 110a may be connected to each other such that the first connection pad 120 disposed in the exposed region 110a may be electrically connected to the lower extension 120-1 disposed in the exposed region 110b. The lower extension 120-1 may extend from the first connection pad 120 in a certain direction and a width of the lower extension 120-1 may be smaller than or equal to a width of the first connection pad 120. In particular, the lower extension 120-1 may extend from the first connection pad 120 in a shape extending from the fourth side surface 100d toward the second side surface 100b.

The first connection pad 120 and the lower extension 120-1 may be formed of at least one conductive material selected from among gold (Au), silver (Ag), aluminum (Al), copper (Cu), and alloys thereof, without being limited thereto. In addition, the first connection pad 120 and the lower extension 120-1 may be composed of multiple layers. The first connection pad 120 and the lower extension 120-1 may be composed of at least two layers selected from a chromium (Cr) layer, an aluminum (Al) layer, a nickel (Ni) layer, and a gold (Au) layer. For example, the first connection pad 120 and the lower extension 120-1 may have a structure in which a chromium layer, an aluminum layer, a nickel layer, and a gold layer are sequentially stacked one above another. Here, each layer may have a thickness of, for example, 8.5 Å, 1,200 Å, 1,600 Å, 900 Å and 2,000 Å.

The first connection pad 120 and the lower extension 120-1 may be formed by depositing metallic materials on the nitride semiconductor stack 110, followed by patterning the metallic materials. That is, the first connection pad 120 and the lower extension 120-1 may be formed by the same process, without being limited thereto.

As the exposed region 110a is spaced apart from the fourth side surface 100d of the light emitting diode, the first connection pad 120 formed in the exposed region 110a may also be spaced apart from the fourth side surface 100d. The nitride semiconductor stack 110 may be disposed between the exposed region 110a and the fourth side surface 100d.

The second connection pad 130 and the upper extension 130-1 may be disposed on the second conductivity type semiconductor layer 113 and may be electrically connected to the second conductivity type semiconductor layer 113. The second connection pad 130 and the upper extension 130-1 may have various shapes on the second conductivity type semiconductor layer 113, and portions of the second connection pad 130 and the upper extension 130-1, through which electric current is supplied to the nitride semiconductor stack 110, may be controlled depending upon the locations and shapes of the second connection pad 130 and the upper extension 130-1. The upper extension 130-1 may be provided singularly or in plural. For example, referring to FIG. 1, two upper extensions 130-1 extending from the second connection pad 130 may be formed to surround the first connection pad 120. The second connection pad 130 and the upper extensions 130-1 may be formed of at least one conductive material selected from among gold (Au), silver (Ag), aluminum (Al), copper (Cu), and alloys thereof, without being limited thereto. In addition, the second connection pad 130 and the upper extension 130-1 may be composed of multiple layers. The second connection pad 130 and the upper extension 130-1 may be composed of, for example, at least two layers selected from a chromium layer, an aluminum layer, a nickel layer, and a gold layer. For example, the second connection pad 130 and the upper extension 130-1 may have a structure in which a chromium layer, an aluminum layer, a nickel layer, and a gold layer are sequentially stacked one above another. Here, each layer may have a thickness of, for example, 8.5 Å, 1,200 Å, 1,600 Å, 900 Å and 2,000 Å. The second connection pad 130 and the upper extension 130-1 may be formed by depositing metallic materials on the nitride semiconductor stack 110, followed by patterning the metallic materials. That is, the second connection pad 130 and the upper extension 130-1 may be formed by the same process, without being limited thereto. In addition, the second connection pad 130 and the upper extension 130-1 may be formed by the same process as the first connection pad 120 and the lower extension 120-1.

For electrical connection of the light emitting diode, the first connection pad 120 and the second connection pad 130 may be connected to the first connection pad 120 and the second connection pad 130 through wire bonding, respectively. The light emitting diode may be electrically connected to an external device and receives power therefrom through wire bonding to the first connection pad 120 and the second connection pad 130.

If the second conductivity type semiconductor layer 113 is a p-type semiconductor layer, the transparent electrode layer 160 composed of Ni/Au, indium tin oxide (ITO), a transparent conducting oxide (TCO), a metal, or a metal oxide, such as NiO, ZnO, and the like may be formed on the second conductivity type semiconductor layer 113. The transparent electrode layer 160 may also be referred to as an ohmic electrode layer. The transparent electrode layer 160 forms ohmic contact with the second conductivity type semiconductor layer 113, thereby improving current spreading efficiency. In addition, the transparent electrode layer 160 maintains a predetermined level of transmittance to improve efficiency and brightness of the light emitting diode. In the structure in which the light emitting diode includes the transparent electrode layer 160, the transparent electrode layer 160 may be interposed between the second connection pad 130 and the second conductivity type semiconductor layer 113 and between the upper extension 130-1 and the second conductivity type semiconductor layer 113.

Referring to FIG. 1 and FIG. 3, the transparent electrode layer 160 may include an opening 160a. The second connection pad 130 may directly contact the second current blocking layer 150 through the opening 160a. The opening 160a is formed between the second connection pad 130 and the second current blocking layer 150 and a width of the second connection pad 130 may be smaller than that of the second connection pad 130. Accordingly, a portion of the periphery of the second connection pad 130 may contact the transparent electrode layer 160 and a portion of a central region thereof may contact the second current blocking layer 150 through the opening 160a. A stepped portion formed by the opening 160a under the second connection pad 130 may increase coupling force of the second connection pad 130, thereby improving structural stability of the light emitting diode.

The first current blocking layer 140 may be interposed between the first connection pad 120 and the first conductivity type semiconductor layer 111 in the exposed region 110a. If the first conductivity type semiconductor layer 111 is an n-type semiconductor layer, the first current blocking layer 140 may be referred to as an n-type current blocking layer. The first current blocking layer 140 may be interposed in some region between the first connection pad 120 and the first conductivity type semiconductor layer 111, thereby enabling effective current spreading over a broad region from the first connection pad 120 to the first conductivity type semiconductor layer 111.

Particularly, if the first current blocking layer 140 is absent in the structure in which the first connection pad 120 is disposed between the upper extensions 130-1, as shown in FIG. 1, there can be a problem of inefficient lateral spreading of electric current supplied through the first connection pad 120. That is, if the first current blocking layer 140 is absent in the structure as shown in FIG. 1, electric current supplied through the first connection pad 120 can be concentrated on the upper extensions 130-1 formed around the first connection pad 120. In addition, although not shown in the drawings, in the light emitting diode according to the exemplary embodiment, the first connection pad 120 is spaced apart from the fourth side surface 100d of the light emitting diode and the upper extensions 130-1 may further extend to a region between the first connection pad 120 and the fourth side surface 100d to surround the first connection pad. This structure can also have a problem of inefficient lateral current spreading.

In order to solve this problem, the first current blocking layer 140 may be interposed between the first conductivity type semiconductor layer 111 and the first connection pad 120. The first current blocking layer 140 can reduce or prevent current crowding on the first conductivity type semiconductor layer 111 under the first connection pad 120 when electric current is supplied through the first connection pad 120. That is, the first current blocking layer 140 serves to spread electric current to the lower extension 120-1, thereby reducing or preventing current crowding at a particular location, that is, on the first conductivity type semiconductor layer under the first connection pad 120.

Specifically, the first current blocking layer 140 may be interposed between the first connection pad 120 and the first conductivity type semiconductor layer 111 in the exposed region 110a. The first current blocking layer 140 may have any shape, such as a circular shape, a rectangular shape, a triangular shape, and the like, without being limited thereto. In particular, the first current blocking layer 140 may have a similar shape to the exposed region 110a. However, it should be understood that the present disclosure is not limited thereto and the first current blocking layer 140 may have various shapes and sizes, as described below with reference to FIGS. 4A-4H.

Here, the area of the first current blocking layer 140 may be restricted in a predetermined range inside the exposed region 110a. That is, although the first current blocking layer 140 may have any area at any location inside the exposed region 110a, it is desirable that the area of the first current blocking layer 140 do not exceed 90% of the area of a region between the first connection pad 120 and the first conductivity type semiconductor layer 111. Although increase in area of the first current blocking layer 140 allows efficient current spreading to improve power of the light emitting diode, forward voltage Vf of the light emitting diode can be rapidly increased if increase in area of the first current blocking layer exceeds a predetermined level. Accordingly, the area of the first current blocking layer 140 between the first connection pad 120 and the first conductivity type semiconductor layer 111 is restricted to 90% or less of the area of the region between the first connection pad 120 and the first conductivity type semiconductor layer 111. In particular, with a structure in which the area of the first current blocking layer 140 between the first connection pad 120 and the first conductivity type semiconductor layer 111 is 90% of the area of the region between the first connection pad 120 and the first conductivity type semiconductor layer 111, the light emitting diode can achieve maximum power efficiency. That is, the light emitting diode can output maximum power without increasing forward voltage. If the area of the first current blocking layer 140 between the first connection pad 120 and the first conductivity type semiconductor layer 111 is 90% or more of the area of the region between the first connection pad 120 and the first conductivity type semiconductor layer 111, forward voltage of the light emitting diode can increase due to lack of an n-contact region.

Referring to FIG. 2 and FIG. 3, in the structure in which the first current blocking layer 140 is interposed between the first connection pad 120 and the first conductivity type semiconductor layer 111, a stepped portion may be formed on an upper surface of the first connection pad 120. The stepped portion increases an area of the upper surface of the first connection pad 120. Increase in the area of the upper surface of the first connection pad 120 can increase ball sear test (BST), thereby increasing bonding strength between wires (not shown) and the first connection pad 120 upon wire bonding.

Furthermore, the first current blocking layer 140 may include a $SiO_2$ layer or a distributed Bragg reflector (DBR) in which low refractivity material layers and high refractivity material layers are alternately stacked one above another. For example, the distributed Bragg reflector may have a structure in which $SiO_2$ layers and $TiO_2$ layers or $SiO_2$ layers and $Nb_2O_5$ layers are alternately stacked one above another to form a reflective insulation layer having high reflectance. The distributed Bragg reflector may have high reflectance with respect to light in a certain wavelength band depending upon structural characteristics and materials thereof.

The light emitting diode may further include the second current blocking layer 150. The second current blocking layer 150 may be interposed between the second connection pad 130 and the second conductivity type semiconductor layer 113 and between the upper extension 130-1 and the second conductivity type semiconductor layer 113 to improve current spreading efficiency. If the second conductivity type semiconductor layer 113 is a p-type semiconductor layer, the second current blocking layer 150 may be referred to as a p-type current blocking layer. In the structure in which the light emitting diode includes the transparent electrode layer 160, the second current blocking layer 150 may be interposed between the second connection pad 130 and the second conductivity type semiconductor layer 113 and between the upper extension 130-1 and the second conductivity type semiconductor layer 113 to be placed under the transparent electrode layer 160. A width of the second current blocking layer 150 interposed between the second connection pad 130 and the second conductivity type semiconductor layer 113 may be greater than or equal to a width of the second connection pad 130. In addition, a width of the second current blocking layer 150 interposed between the upper extensions 130-1 and the second conductivity type semiconductor layer 113 may be greater than or equal to a width of the upper extension 130-1.

The second current blocking layer 150 may include the same material layers as the first current blocking layer 140. That is, the second current blocking layer 150 may include a $SiO_2$ layer or a distributed Bragg reflector (DBR) in which low refractivity material layers and high refractivity material layers are alternately stacked one above another. For example, the distributed Bragg reflector may have a structure in which $SiO_2$ layers and $TiO_2$ layers or $SiO_2$ layers and $Nb_2O_5$ layers are alternately stacked one above another to form an insulation reflective layer having high reflectance. The second current blocking layer 150 may be formed by the same process as the first current blocking layer 140.

The light emitting diode may further include the insulation layer 165 covering a side surface of the nitride semiconductor stack 110. Referring to FIG. 2 and FIG. 3, the side surface of the nitride semiconductor stack 110 may be partially exposed in the exposed regions 110a, 110b. Specifically, in the exposed regions 110a, 110b, side surfaces of the active layer 112 and the second conductivity type semiconductor layer 113 may be exposed. Further, in the exposed regions 110a, 110b, the side surface of the first conductivity type semiconductor layer 111 may be partially exposed.

The insulation layer 165 may cover the side surface of the nitride semiconductor stack 110 exposed in the exposed region 110a. This structure reduces or prevents electrical connection between a wire and the side surface of the nitride semiconductor stack 110 when wire bonding to the first connection pad 120 is performed in the exposed region 110a. The insulation layer 165 improves reliability of the light emitting diode.

FIGS. 4A-4H show various shapes of the first current blocking layer 140 according to the exemplary embodiment of the present disclosure. FIG. 4A to FIG. 4H correspond to a region of FIG. 1, that is, Region C, and illustrate various shapes of the first current blocking layer 140.

Figure 4A:
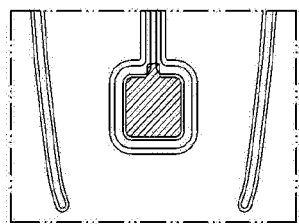
FIG. 4A, FIG. 4B, FIG. 4C, FIG. 4D, FIG. 4E, FIG. 4F, FIG. 4G, and FIG. 4H show various shapes of a first current blocking layer according to the exemplary embodiment.

Referring to FIG. 4A, the first current blocking layer 140 is restrictively interposed in some region between the first connection pad 120 and the first conductivity type semiconductor layer 111 in the exposed region 110a. Here, in the exposed region 110a, the first current blocking layer 140 is not formed outside the region between the first connection pad 120 and the first conductivity type semiconductor layer 111. Further, the first current blocking layer 140 is interposed in some region between the first connection pad 120 and the first conductivity type semiconductor layer 111 and is absent in other regions therebetween, thereby allowing electrical connection between the first connection pad 120 and the first conductivity type semiconductor layer 111 while reducing or preventing increase in forward voltage of the light emitting diode. Further, the first current blocking layer 140 may also be interposed in some region between the lower extension 120-1 and the first conductivity type semiconductor layer 111 in the exposed region 110b.

Figure 4B:
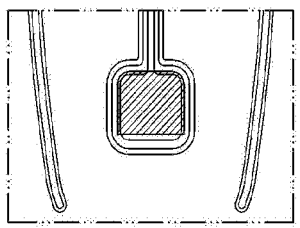
Figure 4C:
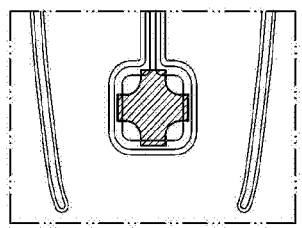
Figure 4D:
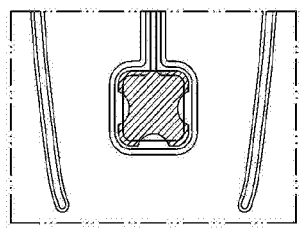
Figure 4E:
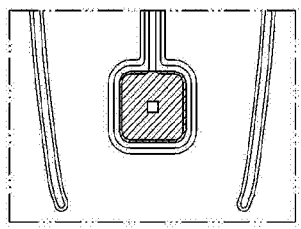

Referring to FIG. 4B to FIG. 4E, the first current blocking layer 140 is formed not only in some region between the first connection pad 120 and the first conductivity type semiconductor layer 111 in the exposed region 110a, but also in other regions in the exposed region 110a. Here, the first current blocking layer 140 may have a structure in which a lower end of the first current blocking layer 140 is removed between the first connection pad 120 and the first conductivity type semiconductor layer 111 as shown in FIG. 4B, a structure in which some side surfaces of the first current blocking layer 140 are depressed as shown in FIG. 4C and FIG. 4D, or a structure in which a central region of the first current blocking layer 140 is removed as shown in FIG. 4E. With such structures, the first connection pad 120 may be electrically connected to the first conductivity type semiconductor layer 111 through such removed or depressed portions thereof and the first current blocking layer 140 occupies a restricted region, thereby reducing or preventing increase in forward voltage of the light emitting diode.

Figure 4F:
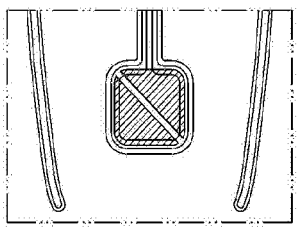
Figure 4G:
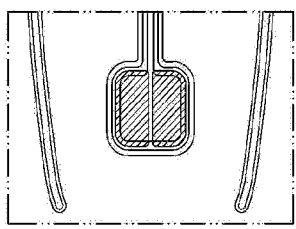

Referring to FIG. 4F and FIG. 4G, the first current blocking layer 140 is formed not only in some region between the first connection pad 120 and the first conductivity type semiconductor layer 111 in the exposed region 110a, but also in other regions in the exposed region 110a. Further, the first current blocking layer 140 may be divided into two regions. However, it should be understood that the present disclosure is not limited thereto and the first current blocking layer 140 may be divided into three or more regions. The first connection pad 120 may be electrically connected to the first conductivity type semiconductor layer 111 through the divided regions and the first current blocking layer 140 occupies a restricted region, thereby reducing or preventing increase in forward voltage thereof.

Figure 4H:
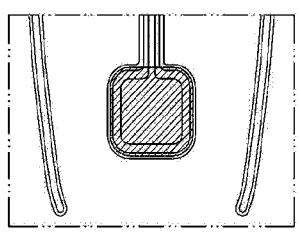

Referring to FIG. 4H, the first current blocking layer 140 is formed over the entirety of the exposed region 110a. Accordingly, in the exposed region 110a, the first connection pad 120 is not electrically connected to the first conductivity type semiconductor layer 111. However, since the lower extension 120-1 electrically connected to the first connection pad 120 is electrically connected to the first conductivity type semiconductor layer 111 through the exposed region 110b, the first connection pad 120 is electrically connected to the first conductivity type semiconductor layer 111.

Figure 5:
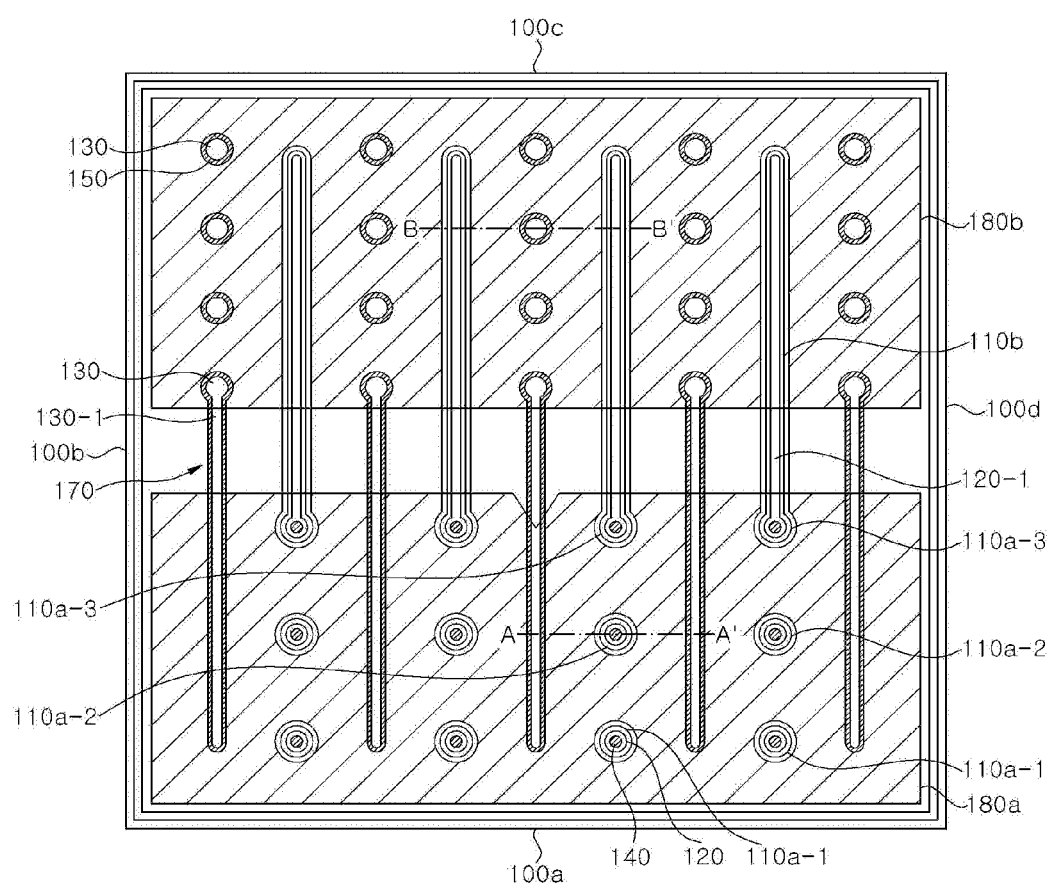
FIG. 5 is a plan view of a light emitting diode according to another exemplary embodiment.
Figure 6:
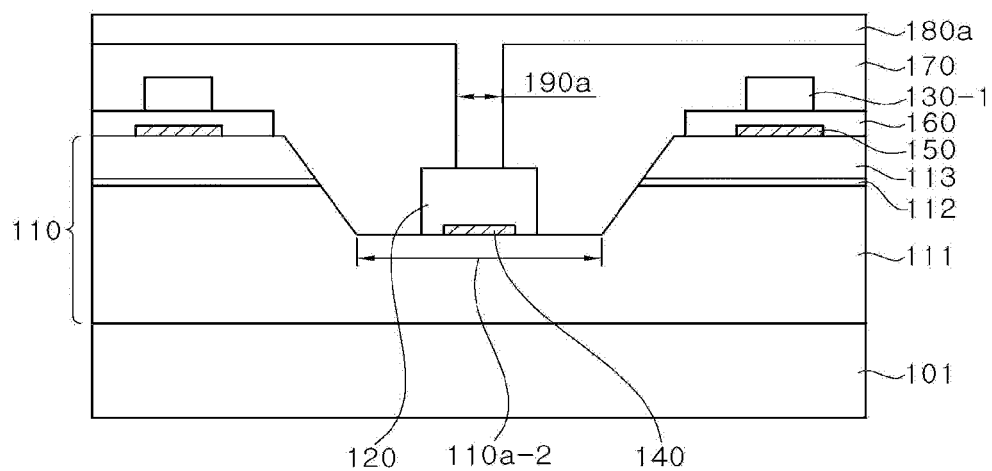
FIG. 6 is a cross-sectional view taken along line A-A' of FIG. 5.
Figure 7:
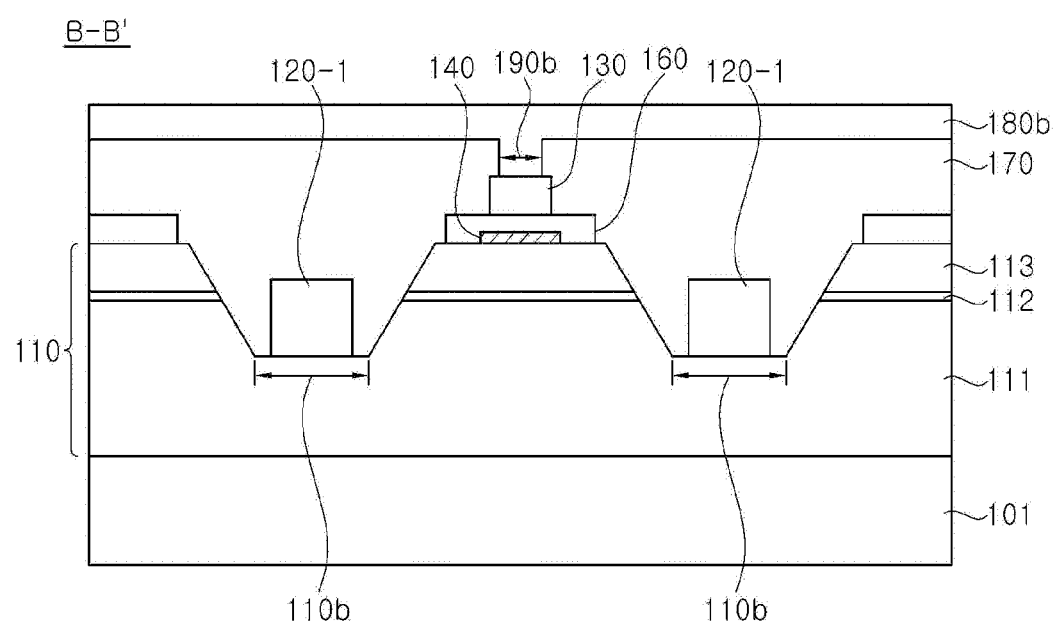
FIG. 7 is a cross-sectional view taken along line B-B' of FIG. 5.

FIG. 5 to FIG. 7 are a plan view and cross-sectional views of a light emitting diode according to another exemplary embodiment of the present disclosure. Specifically, FIG. 5 is a plan view of the light emitting diode according to this exemplary embodiment, FIG. 6 is a cross-sectional view taken along line A-A' of FIG. 5, and FIG. 7 is a cross-sectional view taken along line B-B' of FIG. 5.

The light emitting diode according to this exemplary embodiment is substantially similar to the light emitting diode according to the above exemplary embodiment described with reference to FIG. 1 to FIG. 3 excluding the number, shape and sizes of exposed regions 110a, 110b, first connection pads 120, lower extensions 120-1, second connection pads 130, and upper extensions 130-1. In addition, the light emitting diode according to this exemplary embodiment may further include an ohmic electrode layer 160, an insulation layer 170, and bonding pads 180a, 180b. The following description will focus on different features of the light emitting diode according to this exemplary embodiment and detailed descriptions of the same components will be omitted.

Referring to FIG. 5 to FIG. 7, the light emitting diode includes a nitride semiconductor stack 110, a first connection pad 120, a second connection pad 130, a first current blocking layer 140, and a second current blocking layer 150. In addition, the light emitting diode further includes lower extensions 120-1 extending from the first connection pad 120 in a certain direction and upper extensions 130-1 extending from the second connection pad 130 in a certain direction. The light emitting diode may have a rectangular shape in plan view. According to this exemplary embodiment, the light emitting diode may have a substantially square shape in plan view, and may include a first side surface 100a, a second side surface 100b, a third side surface 100c opposite the first side surface 100a, and a fourth side surface 100d opposite the second side surface 100b. However, it should be understood that the present disclosure is not limited thereto.

The nitride semiconductor stack 110 includes a first conductivity type semiconductor layer 111, an active layer 112 disposed on the first conductivity type semiconductor layer 111, and a second conductivity type semiconductor layer 113 disposed on the active layer 112. Further, the nitride semiconductor stack 110 may include exposed regions 110a, 110b that partially expose the first conductivity type semiconductor layer 111. Current spreading efficiency and a light emitting pattern of the light emitting diode may be determined depending upon the number, locations, and shapes of the exposed regions 110a, 110b.

Referring to FIG. 5, exposed regions 110a, 110b through which the first conductivity type semiconductor layer 111 is partially exposed may include holes. That is, the exposed region 110a may include first holes 110a-1, 110a-2 and a second hole 110a-3. The exposed region 110a may also be referred to as a first exposed region. Each of the first holes 110a-1, 110a-2 and the second hole 110a-3 may be provided in plural. The first holes 110a-1, 110a-2 and the second holes 110a-3 may have a substantially circular or polygonal shape in plan view. The exposed region 110b may extend from each of the second holes 110a-3 in a certain direction. The exposed region 110*b* may also be referred to as a second exposed region. The exposed region 110*b* may be referred to as a third hole. Here, the third holes (or the exposed region) 110*b* may be connected to the second holes 110*a*-3, respectively. In addition, a width of the third holes 110*b* may be smaller than or equal to a width of the first holes 110*a*-1, 110*a*-2 and the second holes 110*a*-3.

For example, as shown in FIG. 5, the first holes 110*a*-1, 110*a*-2 and the second holes 110*a*-3 may have a circular shape in plan view and may be provided in plural. The third holes 110*b* may be formed to extend from the second holes 110*a*-3 in a shape extending from the first side surface 100*a* toward the third side surface 100*c*.

The first connection pad 120 may be electrically connected to the first conductivity type semiconductor layer 111 and particularly, may form ohmic contact with the first conductivity type semiconductor layer 111. That is, the first connection pad 120 may be formed in the exposed region 110*a* including the first holes 110*a*-1, 110*a*-2 and the second holes 110*a*-3 to be electrically connected to the first conductivity type semiconductor layer 111. Accordingly, portions of the first connection pad 120, through which electric current is supplied to the nitride semiconductor stack 110, may be controlled depending upon the locations and shapes of the exposed region 110*a*. As shown in FIG. 5, the first connection pad 120 may be provided in plural in a predetermined pattern based on the exposed region 110*a*, without being limited thereto.

The lower extension 120-1 may be formed in the exposed region (or the third hole) 110*b* to be electrically connected to the first conductivity type semiconductor layer 111. The exposed region 110*b* is connected to the second hole 110*a*-3. Thus, the lower extension 120-1 may be electrically connected to the first connection pad 120 formed in the second hole 110*a*-3. As shown in FIG. 5, the lower extension 120-1 may be provided in plural in a predetermined pattern based on the exposed region 110*b*, without being limited thereto.

The light emitting diode according to this exemplary embodiment may include the second connection pad 130. The second connection pad 130 may be disposed on the nitride semiconductor stack 110 and may form ohmic contact with the second conductivity type semiconductor layer 113. The second connection pad 130 may be provided in plural. In addition, the light emitting diode may include upper extensions 130-1 extending from some portions of the second connection pad 130. The upper extension 130-1 may be formed in a shape extending from the third side surface 100*c* toward the first side surface 100*a* and may be provided in plural. As shown in FIG. 5, the second connection pad 130 and the upper extension 130-1 may be provided in plural in a predetermined pattern, without being limited thereto.

The first connection pad 120 and the second connection pad 130 are provided for electrical connection of the nitride semiconductor stack 110. For example, the first connection pad 120 and the second connection pad 130 may be electrically connected to a first bonding pad 180*a* and a second bonding pad 180*b*, respectively. The light emitting diode may be electrically connected to an external device to receive power from an external power source through the first bonding pad 180*a* and the second bonding pad 180*b*.

The first current blocking layer 140 may be interposed between the first connection pads 120 and the first conductivity type semiconductor layer 111. The first current blocking layer 140 may be interposed in some region between the first connection pads 120 and the first conductivity type semiconductor layer 111, thereby enabling effective current spreading over a broad region to the first conductivity type semiconductor layer 111. In particular, as shown in FIG. 5, in the light emitting diode having the structure in which the first connection pads 120 are disposed between the upper extensions 130-1, there can be a problem of inefficient spreading of current supplied through the first connection pads 120. In order to solve this problem, the first current blocking layer 140 may be interposed between the first conductivity type semiconductor layer 111 and the first connection pads 120, thereby enabling efficient current spreading over a broad region.

Specifically, the first current blocking layer 140 may be interposed between the first connection pad 120 and the first conductivity type semiconductor layer 111 in the exposed region 110*a*. The first current blocking layer 140 may have any shape, such as a circular shape, a rectangular shape, a triangular shape, and the like, without being limited thereto. In particular, the first current blocking layer 140 may have a similar shape to the exposed region 110*a*. However, it should be understood that the present disclosure is not limited thereto and the first current blocking layer 140 may have various shapes and sizes, as described below with reference to FIGS. 4A-4H.

The area of the first current blocking layer 140 may be restricted in a predetermined range inside the exposed region 110*a*. That is, although the first current blocking layer 140 may have any area at any location inside the exposed region 110*a*, it is desirable that the area of the first current blocking layer 140 do not exceed 90% of the area of a region between the first connection pad 120 and the first conductivity type semiconductor layer 111. Although increase in area of the first current blocking layer 140 allows efficient current spreading to improve power of the light emitting diode, forward voltage Vf of the light emitting diode can be rapidly increased if increase in the area of the first current blocking layer exceeds a predetermined level. Accordingly, the area of the first current blocking layer 140 between the first connection pad 120 and the first conductivity type semiconductor layer 111 is restricted to 90% or less of the area of the region between the first connection pad 120 and the first conductivity type semiconductor layer 111. In particular, with a structure in which the area of the first current blocking layer 140 is 90% of the area of the region between the first connection pad 120 and the first conductivity type semiconductor layer 111, the light emitting diode can achieve maximum power efficiency. That is, the light emitting diode can output maximum power without increasing forward voltage. If the area of the first current blocking layer 140 is 90% or more of the area of the region between the first connection pad 120 and the first conductivity type semiconductor layer 111, forward voltage of the light emitting diode can increase due to lack of an n-contact region.

Furthermore, the first current blocking layer 140 may include a $SiO_2$ layer or a distributed Bragg reflector (DBR) in which low refractivity material layers and high refractivity material layers are alternately stacked one above another. For example, the distributed Bragg reflector may have a structure in which $SiO_2$ layers and $TiO_2$ layers or $SiO_2$ layers and $Nb_2O_5$ layers are alternately stacked one above another to form an insulation reflective layer having high reflectance.

In the structure in which the first current blocking layer 140 is interposed between the first connection pad 120 and the first conductivity type semiconductor layer 111, a stepped portion (not shown) may be formed on an upper surface of the first connection pad 120.

The light emitting diode may further include the second current blocking layer 150. The second current blocking layer 150 may be interposed between the second connection pad 130 and the second conductivity type semiconductor layer 113 and between the upper extensions 130-1 and the second conductivity type semiconductor layer 113 to improve current spreading efficiency. If the second conductivity type semiconductor layer 113 is a p-type semiconductor layer, the second current blocking layer 150 may be referred to as a p-type current blocking layer. In the structure in which the light emitting diode includes an ohmic electrode layer 160, the second current blocking layer 150 may be interposed between the second connection pad 130 and the second conductivity type semiconductor layer 113 and between the upper extensions 130-1 and the second conductivity type semiconductor layer 113 to be placed under the ohmic electrode layer 160. The ohmic electrode layer 160 may be a transparent electrode layer or a metal electrode layer. A width of the second current blocking layer 150 interposed between the second connection pad 130 and the second conductivity type semiconductor layer 113 may be greater than or equal to a width of the second connection pad 130. In addition, a width of the second current blocking layer 150 interposed between the upper extensions 130-1 and the second conductivity type semiconductor layer 113 may be greater than or equal to a width of the upper extensions 130-1. The second current blocking layer 150 may include the same material layers as the first current blocking layer 140. The second current blocking layer 150 may be formed by the same process as the first current blocking layer 140.

The light emitting diode may further include the insulation layer 170 formed on the nitride semiconductor stack 110. The insulation layer 170 may include a $SiO_2$ layer or a distributed Bragg reflector (DBR) in which low refractivity material layers and high refractivity material layers are alternately stacked one above another. For example, the distributed Bragg reflector may have a structure in which $SiO_2$ layers and $TiO_2$ layers or $SiO_2$ layers and $Nb_2O_5$ layers are alternately stacked one above another to form an insulation reflective layer having high reflectance. The insulation layer 170 may include a plurality of openings 190a, 190b. The first connection pad 120 may be electrically connected to a first bonding pad 180a, which will be described below, through the opening 190a. In addition, the second connection pad 130 may be electrically connected to a second bonding pad 180b, which will be described below, through the opening 190b. Each of the openings 190a, 190b may be provided in plural.

The first bonding pad 180a and the second bonding pad 180b may be electrically connected to the first connection pad 120 and the second connection pad 130, respectively. Referring to FIG. 5 to FIG. 7, the first bonding pad 180a may contact the first connection pad 120 through the openings 190a and the second bonding pad 180b may contact the second connection pad 130 through the openings 190b.

Figure 8:
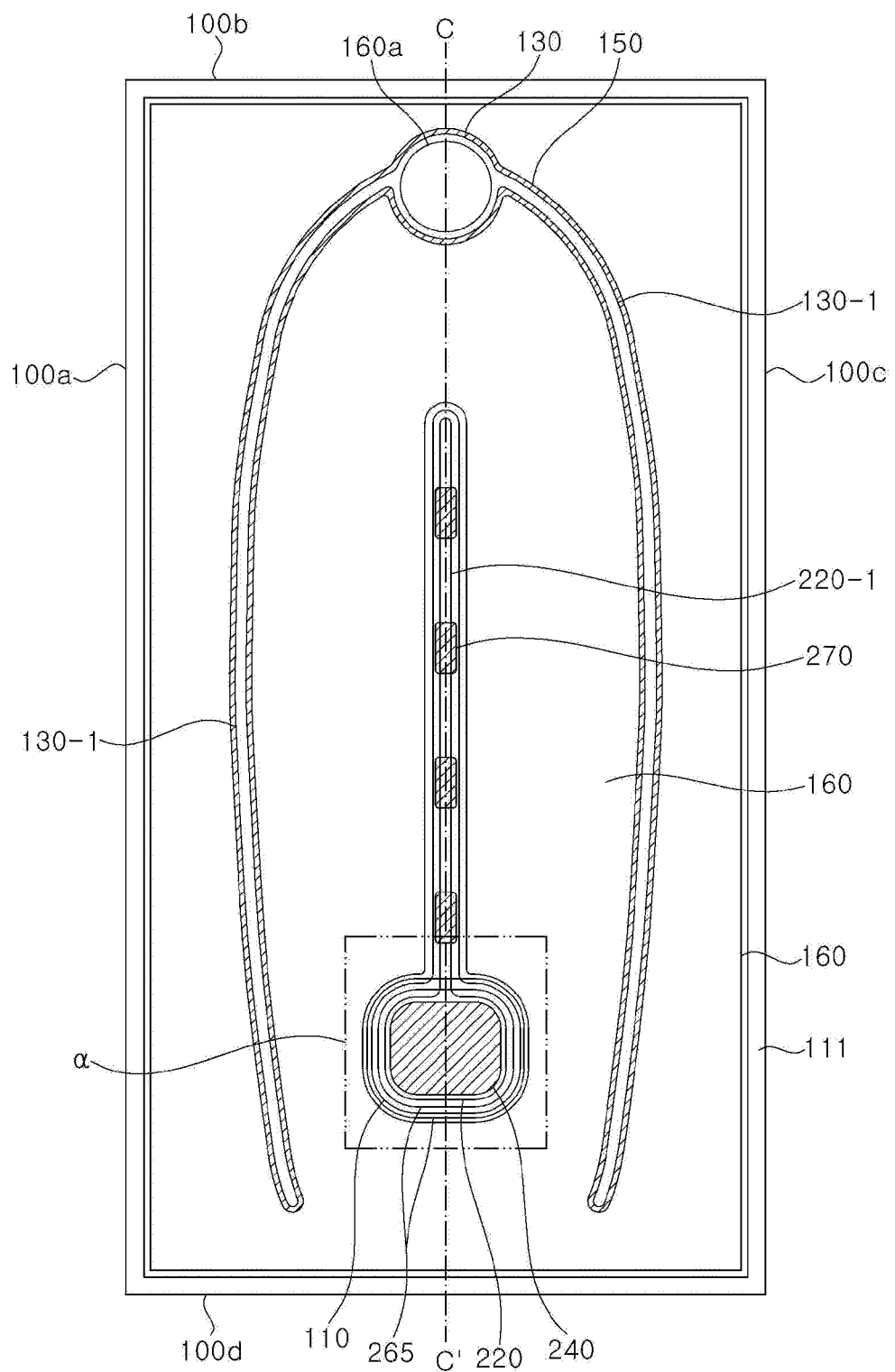
FIG. 8, FIG. 9, and FIG. 10 show a light emitting diode according to a further exemplary embodiment.
Figure 9:
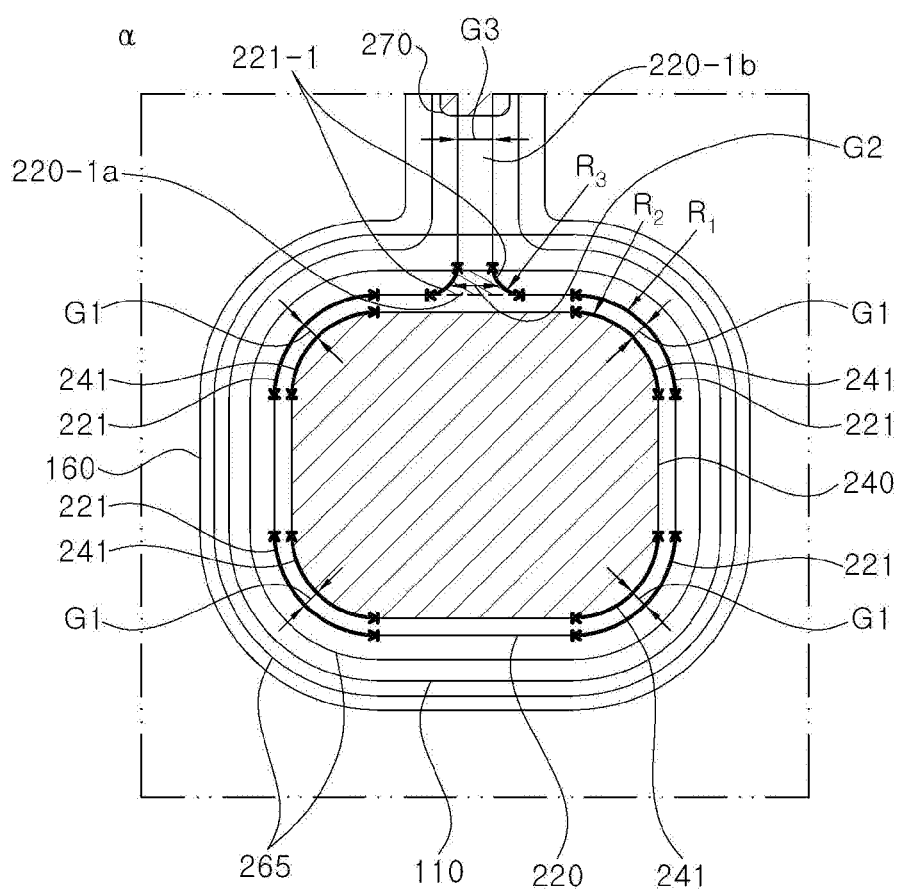
Figure 10:
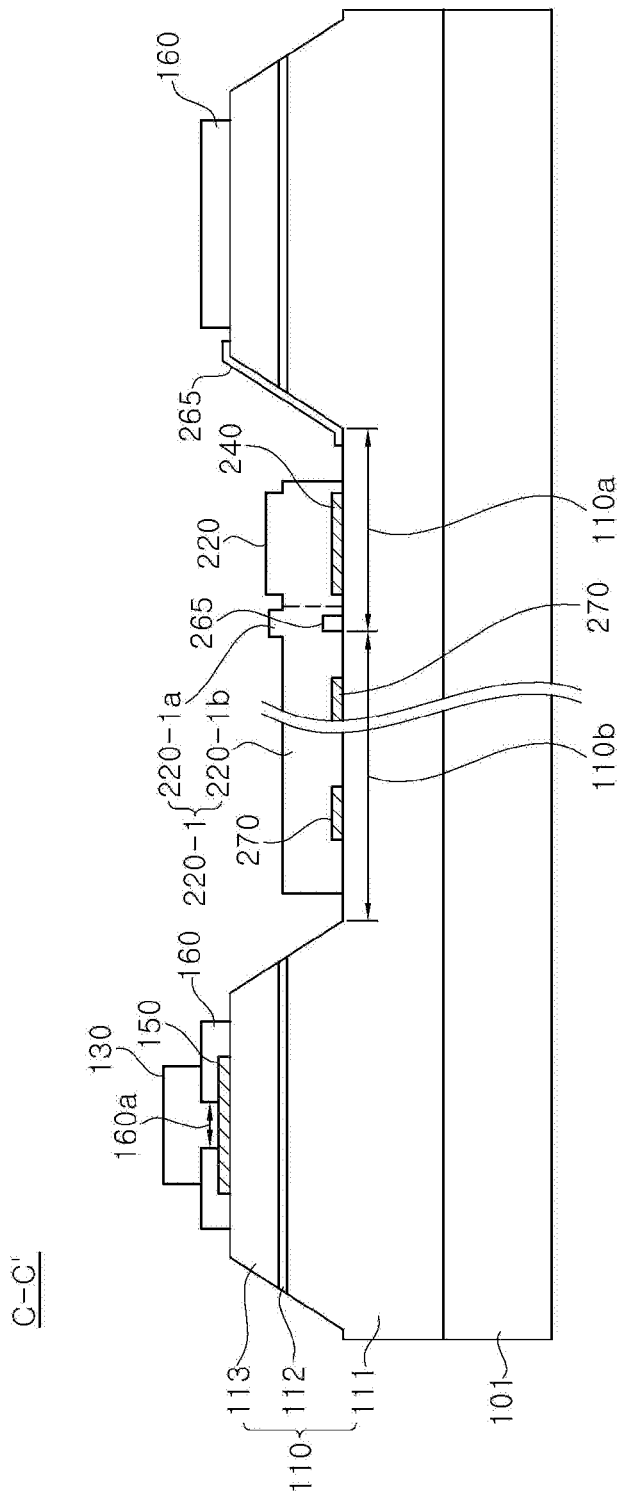

FIG. 8 to FIG. 10 are plan views and a cross-sectional view of a light emitting diode according to a further exemplary embodiment of the present disclosure. Specifically, FIG. 8 is a plan view of the light emitting diode according to this exemplary embodiment, FIG. 9 is an enlarged view of Region α of FIG. 8, and FIG. 10 is a cross-sectional view taken along line C-C' of FIG. 5.

The light emitting diode according to this exemplary embodiment is substantially similar to the light emitting diode according to the above exemplary embodiment described with reference to FIG. 1 excluding the shapes of a first connection pad 220, a lower extension 220-1, a first current blocking layer 240, and an insulation layer 265. In addition, the light emitting diode according to this exemplary embodiment further includes a third current blocking layer 270. The following description will focus on different features of the light emitting diode according to this exemplary embodiment with reference to FIG. 9 and detailed descriptions of the same components will be omitted.

FIG. 9 is a plan view of the first connection pad 220. The first connection pad 220 is connected to the first conductivity type semiconductor layer 111. Referring to FIG. 9, the periphery of the first connection pad 220 includes a first curved region 221. In addition, the periphery of the first connection pad 220 may include linear regions. A shape of the periphery of the first connection pad 220 may be the same as or similar to a shape of an outermost periphery of a region of the first connection pad 220 adjoining the first conductivity type semiconductor layer 111. Accordingly, the periphery of the first connection pad 220 and the outermost periphery of the region of the first connection pad 220 adjoining the first conductivity type semiconductor layer 111 may have the same meaning. The first curved region 221 may mean at least part of the periphery.

The first curved region 221 may have a radius of curvature of R1. That is, the first curved region 221 may have a curvature $1/R_1$. The first curved region 221 may connect the linear regions. Referring to FIG. 9, in the first connection pad 220, four first curved regions 221 connect four linear regions.

With the structure in which the first connection pad 220 includes the first curved regions 221 connecting the linear regions, the first connection pad 220 may not include an angled portion.

This structure may be advantageous in a process of forming the first connection pad 220. For example, the first connection pad 220 may be formed by depositing a metal through a mask by a lift-off process. For the first connection pad 220 designed to include an angled portion, the mask for formation of the first connection pad 220 also includes an angled portion. During deposition of a metal for formation of the first connection pad 220, the metal can be inefficiently deposited at the angled portion of the mask. In this case, it is difficult to obtain a desired first connection pad 220. On the contrary, when the first connection pad 220 includes the first curved regions 221 and is designed to include no angled portion, the first connection pad 220 having a desired shape can be easily obtained.

In addition, when the first connection pad 220 is designed to include an angled portion, electric current supplied through wires bonded to the first connection pad 220 can crowd at the angled portion of the first connection pad 220. This obstructs uniform lateral spreading of electric current in the light emitting diode, thereby causing deterioration in output power of the light emitting diode. When the first connection pad 220 includes the first curved regions 221 and is designed to include no angled portion, the light emitting diode does not suffer from such current crowding, thereby achieving uniform current spreading in the lateral direction. As a result, the light emitting diode can have improved characteristics in terms of ESD (electrostatic discharge) and EOS (electro over-stress).

The first current blocking layer 240 may be interposed between the first connection pad 220 and the first conductivity type semiconductor layer 111. The first current blocking layer 240 may be interposed in some region between the first connection pad 220 and the first conductivity type semiconductor layer 111, thereby allowing efficient current spreading over a broad region from the first connection pad 220 to the first conductivity type semiconductor layer 111.

Referring to an enlarged plan view of the first current blocking layer 240 shown in FIG. 9, the first current blocking layer 240 may have a very similar shape to the first connection pad 220. The periphery of the first current blocking layer 240 may include a second curved region. In addition, the periphery of the first current blocking layer 240 may include linear regions. Here, the second curved region 241 may be disposed adjacent to an inner side of the first curved region 221. For example, the first curved region 221 and the second curved region 241 may have the same center (not shown), in which the second curved region 241 may be disposed inside a sector-shaped region defined by the first curved region 221 and the center. That is, within a region defined by the first curved region 221 and imaginary straight lines connecting both ends of the first curved region 221 to the center of the first curved region 221, the second curved region 241 may be disposed parallel to the first curved region 221. In addition, the second curved region 241 may have a radius of curvature of $R_2$, which may be less than $R_1$. As a result, a gap G1 between the first curved region 221 and the second curved region 241 disposed inside the first curved region 221 may be kept uniform.

Further, the gap G1 between the first curved region 221 and the second curved region 241 may be the same as a gap between a linear region of the first connection pad 220 and a linear region of the first current blocking layer 240. As a result, as defined by the first current blocking layer 240, a contact region between the first connection pad 220 and the first conductivity type semiconductor layer 111 may have a uniform width. With this structure, the light emitting diode allows uniform distribution of electric current supplied through the first connection pad 220 in any direction.

The lower extension 220-1 may extend from the first connection pad 220 and may be connected to the first conductivity type semiconductor layer 111. Referring to FIG. 9, the lower extension 220-1 may include a connecting portion 220-1a and a main extension 220-1b. The connecting portion 220-1a may connect the main extension 220-1b to the first connection pad 220.

FIG. 9 shows a plan view of the connecting portion 220-1a. Referring to FIG. 9, the periphery of the connecting portion 220-1a may include third curved regions 221-1. The connecting portion 220-1a may include two third curved regions 221-1, which may have a radius of curvature of $R_3$. In the structure in which the connecting portion 220-1a includes the third curved regions 221-1, the connecting portion 220-1a may have a width G2 that gradually decreases with increasing distance from the first connection pad 220. Here, the minimum width of the connecting portion 220-1a may be greater than the gap G1 between the first curved region 221 and the second curved region 241. As a result, a relatively large fraction of electric current supplied through the first connection pad 220 can be efficiently supplied to the connecting portion 220-1a having a relatively large area. In addition, when the connecting portion 220-1a has a relatively large width G2, disconnection between the connecting portion 220-1a and the first connection pad 220 can be suppressed, thereby improving reliability of the light emitting diode.

Here, $R_3$ is less than $R_1$ and $R_2$. That is, the third curved region 221-1 may be further curved than the first curved region 221 and the second curved region 241. If $R_3$ is greater than $R_1$ or $R_2$, the connecting portion 220-1a adjacent to the first connection pad 220 has a relatively large width. That is, a planar region of the connecting portion 220-1a can become very large. This structure requires larger exposed regions 110a, 110b, thereby reducing output power of the light emitting diode through reduction of a luminous region.

The main extension 220-1b is connected at one end thereof to the connecting portion 220-1a. A width G3 of the main extension 220-1b may be greater than or equal to the gap G1 between the first curved region 221 and the second curved region 241. For example, the width G3 of the main extension 220-1b may be 5 µm and the gap G1 between the first curved region 221 and the second curved region 241 may be 4 µm. However, it should be understood that the width G3 of the main extension 220-1b and the gap G1 between the first curved region 221 and the second curved region 241 are not limited thereto and may be changed in various way within the scope of the present disclosure.

As described above, the gap G1 between the first curved region 221 and the second curved region 241 is related to a connection area between the first connection pad 220 and the first conductivity type semiconductor layer 111. That is, as the gap G1 between the first curved region 221 and the second curved region 241 increases, the connection area between the first connection pad 220 and the first conductivity type semiconductor layer 111 increases. When the width G2 of the connecting portion 220-1a is increased above the gap G1 between the first curved region 221 and the second curved region 241 or the width G3 of the main extension 220-1b is increased above the gap G1 between the first curved region 221 and the second curved region 241, electric current injected into the first connection pad 220 can be more efficiently guided toward the lower extension 220-1.

The insulation layer 265 may cover a portion of the side surface of the semiconductor stack 110 in the exposed region 110a. Specifically, in the exposed region 110a, the side surfaces of the active layer 112 and the second conductivity type semiconductor layer 113 may be partially exposed. The insulation layer 265 covers the exposed side surfaces of the active layer 112 and the second conductivity type semiconductor layer 113 to reduce or prevent wires bonded to the first connection pad 220 from being connected to the exposed regions of the active layer 112 and the second conductivity type semiconductor layer 113. As a result, the light emitting diode can have improved reliability.

Referring to FIG. 9 and FIG. 10, according to this exemplary embodiment, the insulation layer 265 may be disposed under the lower extension 220-1 unlike the insulation layer 265 illustrated in FIG. 1 to FIG. 3. That is, according to this exemplary embodiment, the insulation layer 265 may have a continuous bond shape and may be partially covered by the lower extension 220-1. Thus, according to this exemplary embodiment, the insulation layer 265 may have better structural stability than the insulation layer 265 having a disconnected structure shown in FIG. 1 to FIG. 3. For example, according to this exemplary embodiment, a portion of the insulation layer 265 may be secured by the lower extension 220-1, thereby reducing or preventing the insulation layer 265 from being separated from other layers.

In addition, the width G2 of the connecting portion 220-1a may be greater than the gap between the first curved region 221 and the second curved region 241 or the width G3 of the main extension 220-1b, as described above. Accordingly, the connection area between the connecting portion 220-1a and the first conductivity type semiconductor layer 111 can be relatively large, causing inefficient supply of electric current to the main extension 220-1b. Accordingly, a portion of the insulation layer 265 may be disposed under the connecting portion 220-1a to restrict the connection area between the connecting portion 220-1a and the first conductivity type semiconductor layer 111, thereby improving supply of electric current to the main extension 220-1b.

The third current blocking layer 270 may be disposed under the lower extension 220-1. Referring to FIG. 8 and FIG. 10, the third current blocking layer 270 may include a plurality of dots separated from each other. The third current blocking layer 270 may have a greater width than the lower extension 220-1, specifically the main extension 220-1b. With this structure, the third current blocking layer 270 can restrict connection of the main extension 220-1b to the first conductivity type semiconductor layer 111. The main extension 220-1b may be discontinuously connected to the first conductivity type semiconductor layer 111 by the third current blocking layer 270. That is, the main extension 220-1b may be connected to the first conductivity type semiconductor layer 111 only in regions between the plurality of dots. A connection distance between the lower extension 220-1 and the first conductivity type semiconductor layer 111 may be controlled by controlling a separation distance between the dots. The distance between the dots may be set in various ways instead of being limited to a particular distance. For example, the dots may be separated from each other by a constant value.

The third current blocking layer 270 allows electric current supplied through the first connection pad 220 to be delivered to the lower extension 220-1, specifically a distal end of the main extension 220-1b, thereby enabling supply of electric current over a broad region. Here, the third current blocking layer 270 is not disposed at the distal end of the main extension 220-1b. This structure allows electric current to be efficiently supplied toward the upper extension 130-1 or the second connection pad 130 through connection of the distal end of the main extension 220-1b to the first conductivity type semiconductor layer 111.

Figure 11:
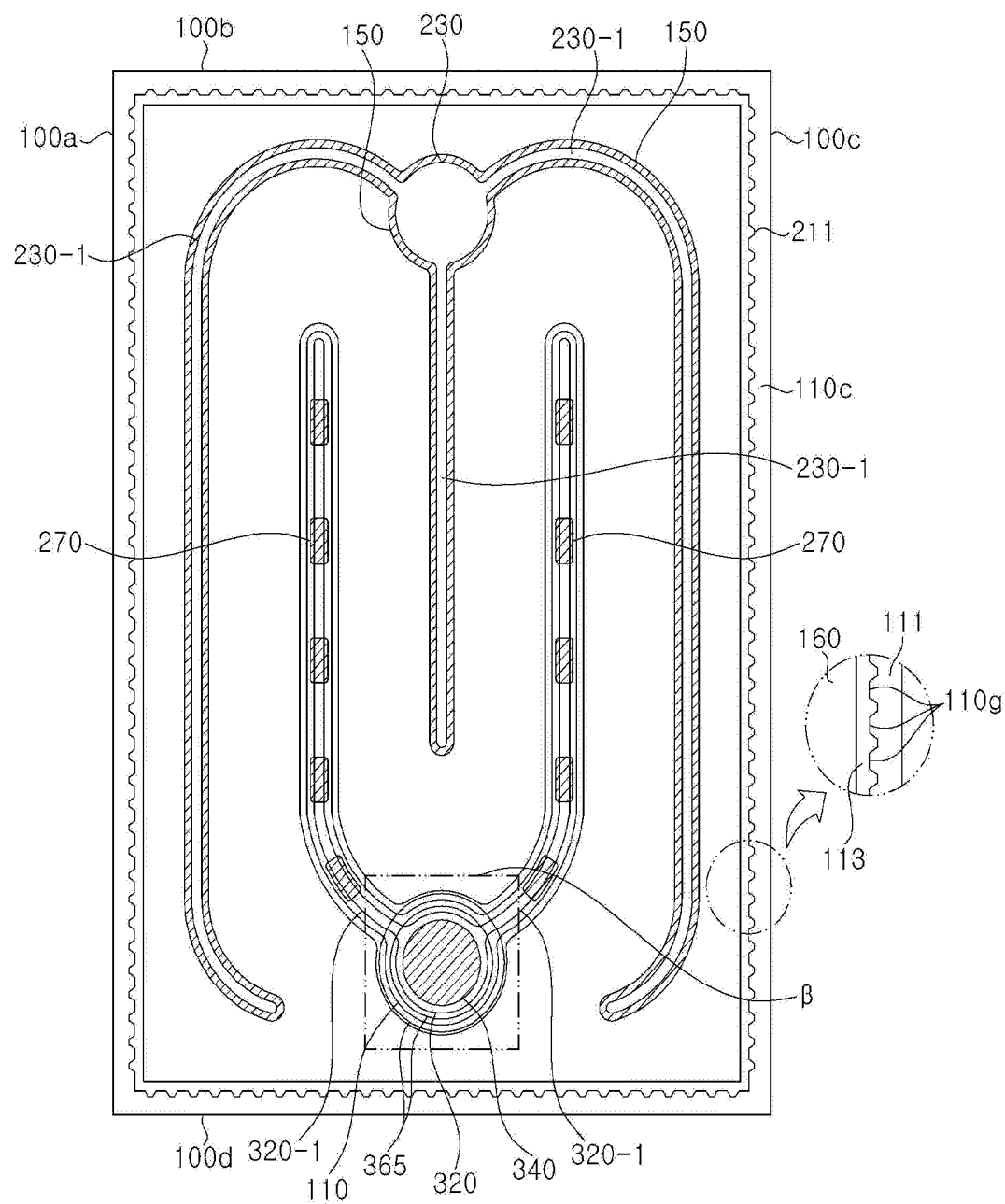
FIG. 11 and FIG. 12 show a light emitting diode according to yet another exemplary embodiment.
Figure 12:
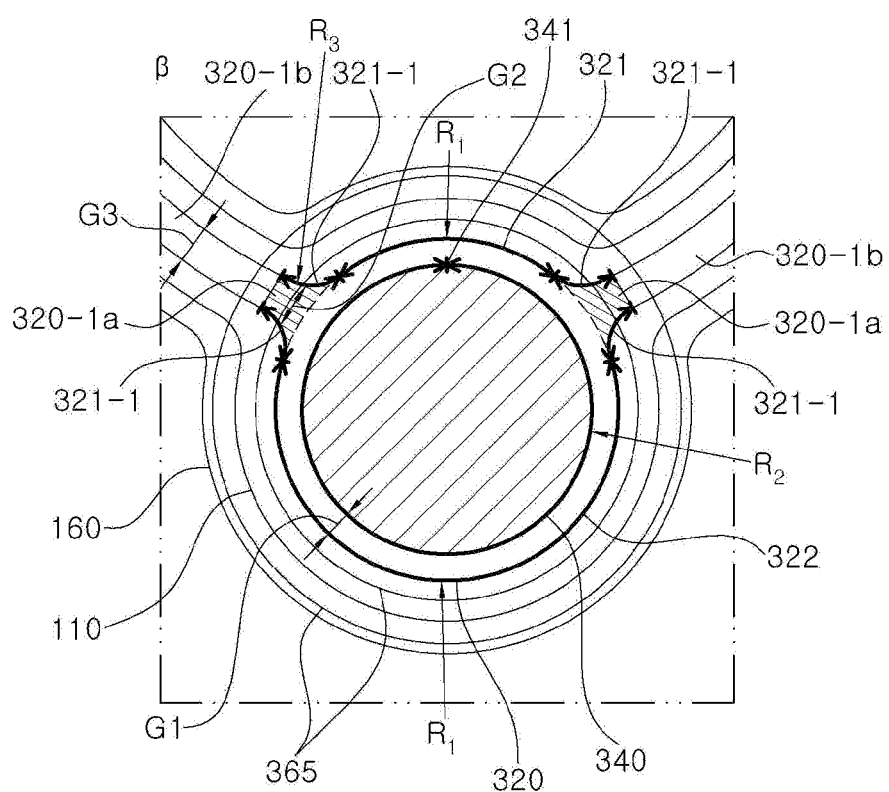

FIG. 11 and FIG. 12 are plan views of a light emitting diode according to yet another exemplary embodiment of the present disclosure. Specifically, FIG. 11 is a plan view of the light emitting diode according to this exemplary embodiment and FIG. 12 is an enlarged view of Region β of FIG. 11.

The light emitting diode according to this exemplary embodiment is substantially similar to the light emitting diode according to the above exemplary embodiment described with reference to FIG. 8 to FIG. 10 excluding the shapes of the side surface of a semiconductor stack 110, a first connection pad 320, lower extensions 320-1, upper extensions 230-1, and a first current blocking layer 340. The following description will focus on different features of the light emitting diode according to this exemplary embodiment and detailed descriptions of the same components will be omitted.

The side surface of the semiconductor stack 110 may include a plurality of grooves 110g. Referring to FIG. 11, the semiconductor stack 110 may include an exposed region 110c that exposes a first conductivity type semiconductor layer 111 through a second conductivity type semiconductor layer 113 and an active layer 112 near each of the side surfaces 100a to 100d of the light emitting diode.

With the exposed regions 110c formed on the side surfaces 100a to 100d of the light emitting diode, the side surfaces of the active layer 112 and the second conductivity type semiconductor layer 113 may be exposed along the side surfaces 100a to 100d of the light emitting diode. In addition, a portion of the side surface of the first conductivity type semiconductor layer 111 may be exposed. The exposed side surfaces of the active layer 112 and the second conductivity type semiconductor layer 113 (and the first conductivity type semiconductor layer 111) may include a plurality of grooves 110g depressed therein. The plurality of grooves 110g may be formed along each of the side surfaces 100a to 100d of the light emitting diode, as shown in the drawings.

The plurality of grooves 110g may improve extraction efficiency of light emitted through the exposed side surfaces of the active layer 112 and the second conductivity type semiconductor layer 113. That is, the plurality of grooves 110g may reduce total internal reflection of light emitted through the side surfaces of the active layer 112 and the second conductivity type semiconductor layer 113, thereby improving overall light extraction efficiency of the light emitting diode.

FIG. 12 is an enlarged plan view of the first connection pad 320 and the first current blocking layer 340. Referring to FIG. 12, the periphery of the first connection pad 320 includes a first curved region. For example, the first connection pad 320 may include two first curved regions 321, 322 with two lower extensions 320-1 interposed therebetween. Here, as the first connection pad 320 has a circular shape, the two first curved regions 321, 322 may have the same radius of curvature of $R_1$ as the first connection pad 320. That is, the first curved regions 321, 322 may have a curvature of $1/R_1$.

The first current blocking layer 340 is interposed between the first connection pad 320 and the first conductivity type semiconductor layer 111 and may include a second curved region 341. As shown in FIG. 12, since the first current blocking layer 340 has a similar circular shape to the first connection pad 320 in plan view, the second curved region 341 may have a radius of curvature of $R_2$. Here, the radius of curvature of $R_1$ of the first curved regions 321, 322 disposed at relatively outer locations may be greater than the radius of curvature of $R_2$ of the second curved region 341 disposed at a relatively inner location.

A gap G1 between the first curved regions 321, 322 and the second curved region 341 may be kept uniform. As a result, as defined by the first current blocking layer 340, a contact region between the first connection pad 320 and the first conductivity type semiconductor layer 111 may have a uniform width. With this structure, the light emitting diode allows uniform distribution of current supplied through the first connection pad 220.

The lower extension 320-1 may be provided in plural. Referring to FIG. 11 and FIG. 12, two lower extensions 320-1 extend from the first connection pad 320 in a shape extending from the fourth side surface 100d of the light emitting diode towards the second side surface 100b thereof. However, it should be understood that the shape and number of lower extensions 320-1 are not limited to those shown in FIG. 11 and FIG. 12 and may be changed in various ways without departing from the scope of the present disclosure.

Each of the lower extensions 320-1 may include a connecting portion 320-1a and a main extension 320-1b. The connecting portion 320-1a may connect the main extension 320-1b to the first connection pad 320. Referring to the plan view of FIG. 12 illustrating the shape of the connecting portion 320-1a, the periphery of the connecting portion 320-1a may include a third curved region 321-1. Here, the third curved region 321-1 may have a radius of curvature of R3.

In the structure in which the connecting portion 320-1a includes the third curved region 321-1, the width G2 of the connecting portion 320-1a may decrease with increasing distance from the first connection pad 320. Here, the width G2 of the connecting portion 320-1a adjacent to the first connection pad 320 may be greater than the gap G1 between the first curved regions 321, 322 and the second curved region 341. As a result, a relatively large fraction of electric current supplied through the first connection pad 320 can be efficiently supplied to the connecting portion 320-1*a* having a relatively large area.

Here, R3 may be less than R1 and R2. That is, the third curved region 321-1 may be further curved than the first curved regions 321, 322 and the second curved region 341. If R3 is greater than R1 or R2, the connecting portion 320-1*a* adjacent to the first connection pad 320 has a relatively large width. That is, a planar region of the connecting portion 320-1*a* may become very large. This structure requires larger exposed regions 110*a*, 110*b*, thereby reducing output power of the light emitting diode through reduction of a luminous region.

The main extension 320-1*b* is connected at one end thereof to the connecting portion 320-1*a*. The main extension 320-1*b* may include a linear region and a curved region interposed between the linear region and the connecting portion 320-1*a*. A width G3 of the main extension 320-1*b* may be greater than or equal to the gap G1 between the first curved regions 321, 322 and the second curved region 341.

The upper extension 230-1 extends from the second connection pad 230 and may be provided in plural. Referring to FIG. 11, three upper extensions 230-1 extend from the second connection pad 230. The upper extensions 230-1 generally extend from the second side surface 100*b* of the light emitting diode toward the fourth side surface 100*d*. Here, two upper extensions 230-1 may be configured to surround the lower extensions 320-1 and the first connection pad 320, and one upper extension 230-1 may be interposed between two lower extensions 320-1. With the arrangement of the first connection pad 320, the lower extensions 320-1, the second connection pad 230 and the upper extensions 230-1 as shown in FIG. 11, the light emitting diode allows efficient lateral spreading of electric current.

Figure 13:
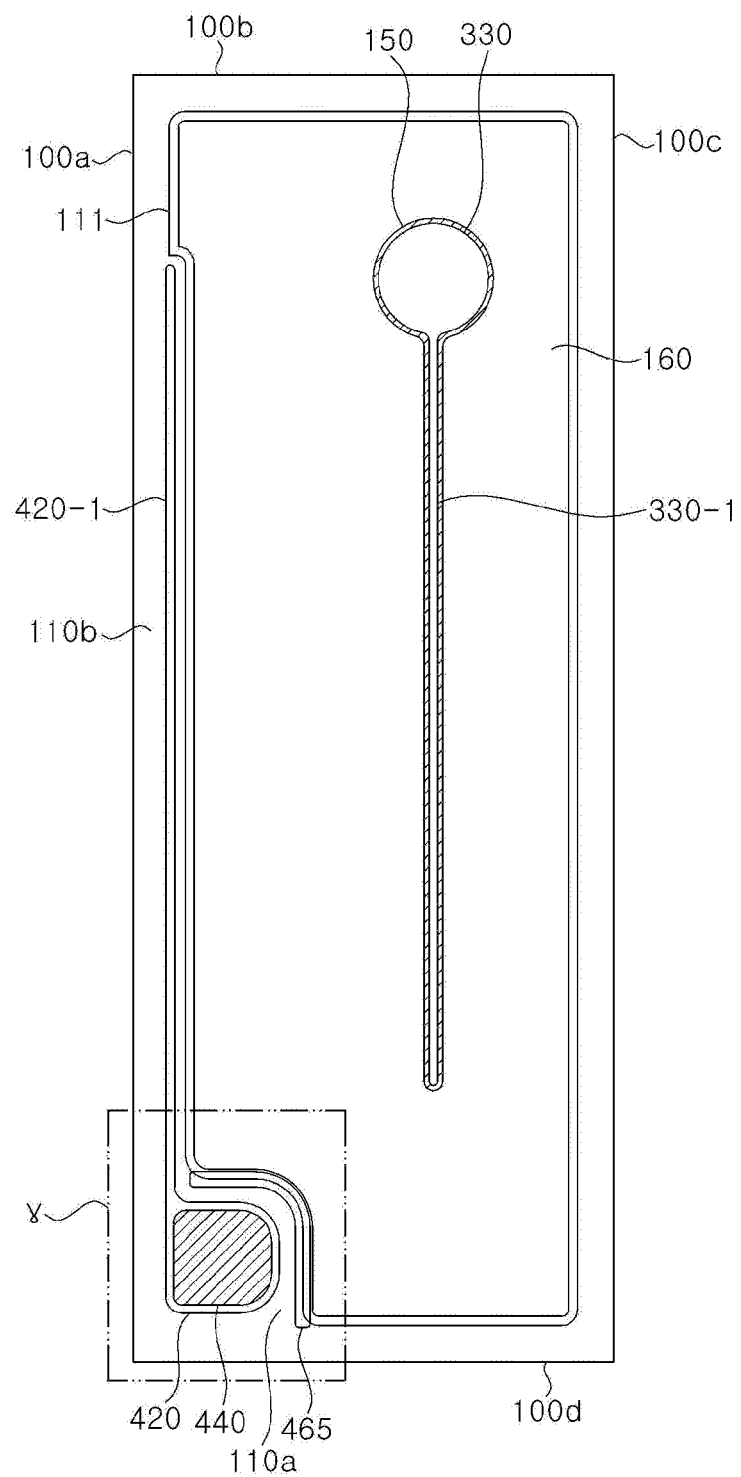
FIG. 13 and FIG. 14 show a light emitting diode according to yet another exemplary embodiment.
Figure 14:
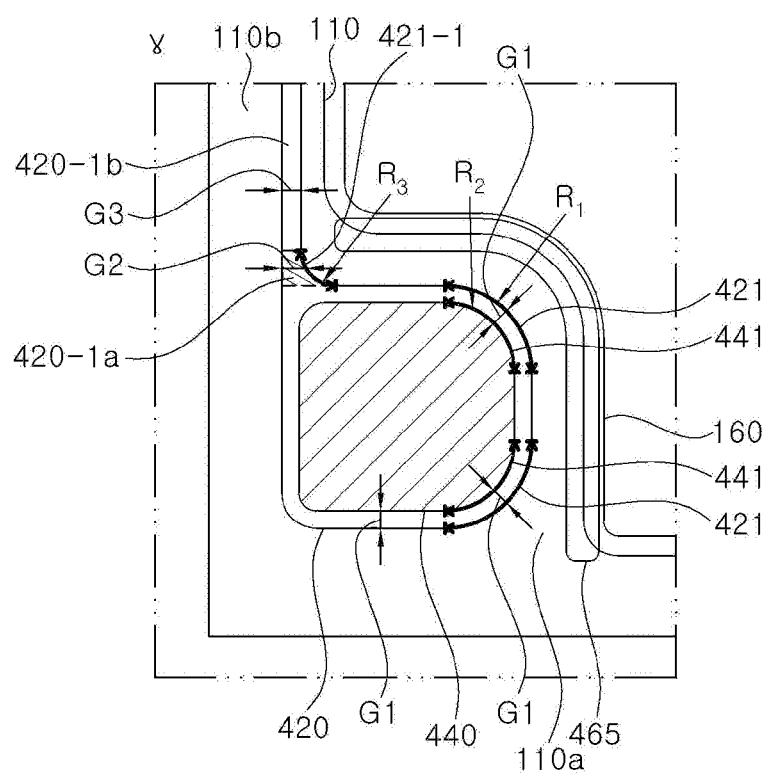

FIG. 13 and FIG. 14 are plan views of a light emitting diode according to yet another exemplary embodiment of the present disclosure. Specifically, FIG. 13 is a plan view of the light emitting diode according to this exemplary embodiment and FIG. 14 is an enlarged view of Region γ of FIG. 13.

The light emitting diode according to this exemplary embodiment is substantially similar to the light emitting diode according to the above exemplary embodiment described with reference to FIG. 8 to FIG. 10 excluding the shapes of exposed regions, a first connection pad 420, a lower extension 420-1, a first current blocking layer 440, and an upper extension 330-1. In addition, the light emitting diode according to this exemplary embodiment does not include a third current blocking layer. The following description will focus on different features of the light emitting diode according to this exemplary embodiment and detailed descriptions of the same components will be omitted.

The exposed regions 110*a*, 110*b* may be formed through the second conductivity type semiconductor layer 113 and the active layer 112 to expose the first conductivity type semiconductor layer 111. Referring to FIG. 13, the exposed region 110*a* for the first connection pad 420 is disposed adjacent to a region of the light emitting diode in which the first side surface 100*a* meets the fourth side surface 100*d*, and the exposed region 110*b* for the lower extension 420-1 may be disposed adjacent to the first side surface 100*a*.

The first connection pad 420 may be connected to the first conductivity type semiconductor layer 111 through the exposed region 110*a*. The periphery of the first connection pad 420 may include linear regions and first curved regions 421. For example, referring to a plan view of the first connection pad 420 shown in FIG. 14, two first curved regions 421 may be disposed adjacent to the side surface of the semiconductor stack 110 exposed during formation of the exposed region 110*a*. Each of the first curved regions 421 has a radius of curvature of $R_1$ and connects the linear regions.

The first current blocking layer 440 may be interposed between the first connection pad 420 and the first conductivity type semiconductor layer 111, and the periphery of the first current blocking layer 440 may include linear regions and second curved regions 441. The second curved region 441 may have a radius of curvature of $R_2$ and may be disposed inside the first curved region 421. Specifically, the first curved region 421 and the second curved region 441 have the same center, in which the first curved region 421 may be disposed inside a sector shape defined by the second curved region 441 and the first curved region 421. That is, the second curved region may be disposed inside a region defined by the first curved region and imaginary straight lines connecting both ends of the first curved region to the center of the first curved region. Here, $R_2$ is less than $R_1$. In addition, the gap G1 between the first curved region 421 and the second curved region 441 may be kept uniform. Further, the gap G1 between the first curved region 421 and the second curved region 441 may be the same as a gap between a linear region of the first connection pad 420 and a linear region of the first current blocking layer 440. As a result, as defined by the first current blocking layer 440, a contact region between the first connection pad 420 and the first conductivity type semiconductor layer 111 may have a uniform width. In particular, the contact region between the first connection pad 420 and the first conductivity type semiconductor layer 111 may have a uniform width at a portion near the exposed semiconductor stack 110. With this structure, the light emitting diode allows uniform distribution of current supplied through the first connection pad 420 in any direction.

The lower extension 420-1 may be connected to the first conductivity type semiconductor layer 111 in the exposed region 110*b* formed along the first side surface 100*a* of the light emitting diode. The lower extension 420-1 may extend from the first connection pad 420 along the first side surface 100*a* of the light emitting diode.

The lower extension 420-1 may include a connecting portion 420-1*a* and a main extension 420-1*b*. The connecting portion 420-1*a* may connect the main extension 420-1*b* to the first connection pad 420. Referring to a plan view of the connecting portion 420-1*a* shown in FIG. 14, the periphery of the connecting portion 420-1*a* may include a third curved region 421-1. The third curved region 421-1 may have a radius of curvature of $R_3$. However, unlike the connecting portion according to the exemplary embodiment shown in FIG. 8 and FIG. 12, the connecting portion 420-1*a* according to this exemplary embodiment includes a single third curved region 421-1, which is disposed adjacent to the exposed side surface of the semiconductor stack 110. Accordingly, the width G2 or area of the connecting portion 420-1*a* according to this exemplary embodiment may be smaller than the width or area of the connecting portion 420-1*a* shown in FIG. 8 and FIG. 12, but is not limited thereto. Thus, in the light emitting diode according to this exemplary embodiment, an insulation layer 465 is not disposed under the connecting portion 420-1*a* having a relatively small width or area, whereby the entirety of the connecting portion 420-1a may be connected to the first conductivity type semiconductor layer 111.

As the connecting portion 420-1a includes the third curved region 421-1, the width G2 of the connecting portion 420-1a decreases with increasing distance from the first connection pad 420. Here, the width G2 of the connecting portion 420-1a near the first connection pad 420 may be greater than the gap G1 between the first curved region 421 and the second curved region 441. As a result, a relatively large fraction of electric current supplied through the first connection pad 420 can be efficiently supplied to the connecting portion 420-1a having a relatively large area.

Here, $R_3$ may be less than $R_1$ and $R_2$. That is, the third curved region 421-1 may be further curved than the first curved region 421 and the second curved region 441. If $R_3$ is greater than $R_1$ or $R_2$, the width G2 of the connecting portion 420-1a adjacent to the first connection pad 420 is significantly increased. That is, a planar region of the connecting portion 420-1a may become very large. This structure requires larger exposed regions 110a, 110b, thereby reducing output power of the light emitting diode through reduction of a luminous region.

The main extension 420-1b is connected at one end thereof to the connecting portion 420-1a. A width G3 of the main extension 420-1b may be greater than or equal to the gap G1 between the first curved region 421 and the second curved region 441.

The upper extension 330-1 may extend from the second connection pad 330. Referring to FIG. 13, the upper extension 330-1 may extend from the second connection pad 330 toward the fourth side surface 100d of the light emitting diode. The upper extension 330-1 and the lower extension 420-1 may be disposed to face each other, thereby enabling broad current spreading over the entire region of the light emitting diode.

Figure 15:
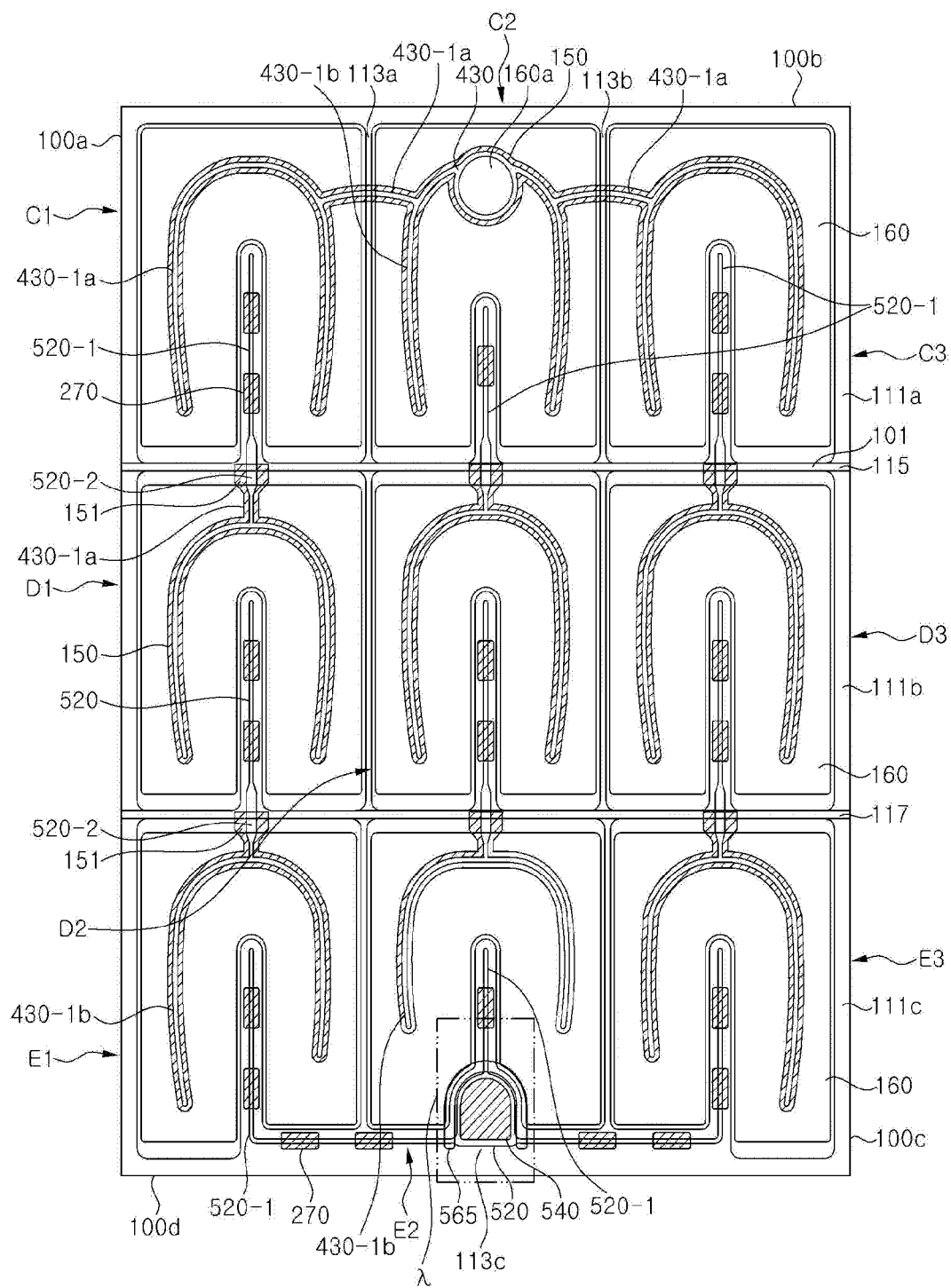
FIG. 15 and FIG. 16 show a light emitting diode according to yet another exemplary embodiment.
Figure 16:
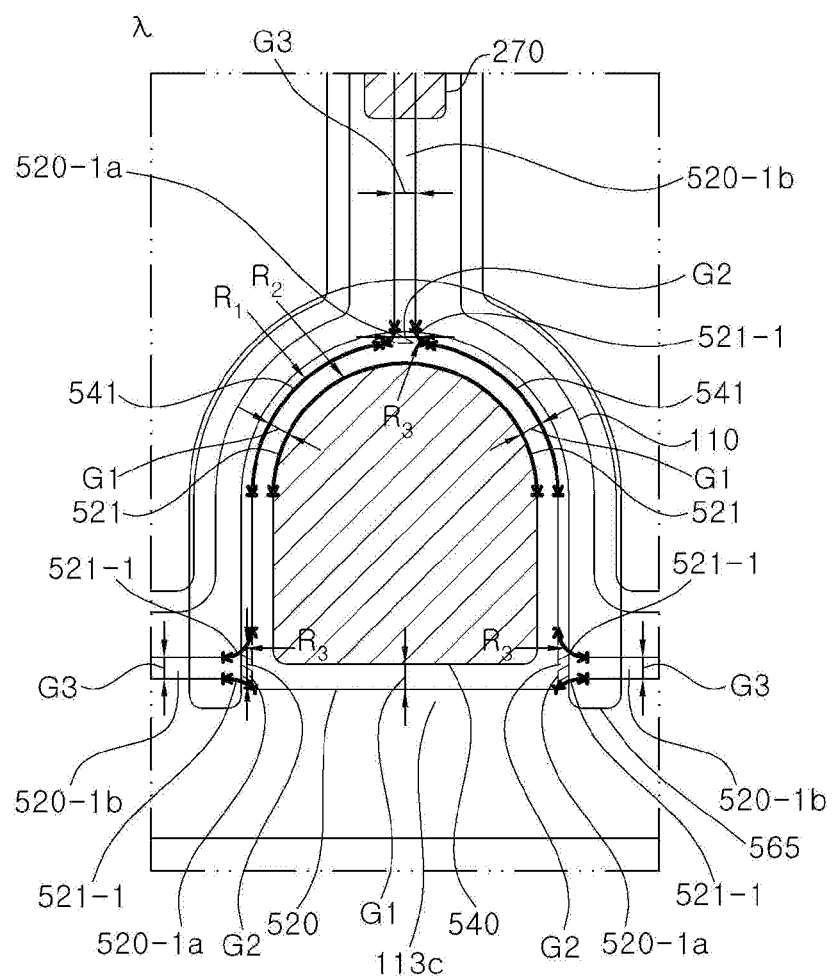

FIG. 15 and FIG. 16 are plan views of a light emitting diode according to yet another exemplary embodiment of the present disclosure. Specifically, FIG. 15 is a plan view of the light emitting diode according to this exemplary embodiment and FIG. 16 is an enlarged view of Region λ of FIG. 15.

The light emitting diode according to this exemplary embodiment is substantially similar to the light emitting diode according to the above exemplary embodiment described with reference to FIG. 8 to FIG. 10 excluding the presence of a plurality of light emitting cells directly or indirectly connected to each other and the shapes of a first connection pad 520, lower extensions 520-1, a first current blocking layer 540, a second connection pad 430, and upper extensions 430-1. The following description will focus on different features of the light emitting diode according to this exemplary embodiment and detailed descriptions of the same components will be omitted.

Referring to FIG. 15, the light emitting diode according to this exemplary embodiment may include first to third light emitting cells C1, C2, C3, fourth to sixth light emitting cells D1, D2, D3, and seventh to ninth light emitting cells E1, E2, E3. In addition, the light emitting diode includes a first connection pad 520, a second connection pad 430, upper extensions 430-1a, 430-1b, and lower extensions 520-1. The upper extensions 430-1 may be divided into assistant upper extensions 430-1a and main upper extensions 430-1b.

The first to third light emitting cells C1, C2, C3 may be isolated from the fourth to sixth light emitting cells D1, D2, D3 by an isolation trench 115. In addition, the fourth to sixth light emitting cells D1, D2, D3 may be isolated from the seventh to ninth light emitting cells E1, E2, E3 by an isolation trench 117. Accordingly, the first to third light emitting cells C1, C2, C3 may share a first conductivity type semiconductor layer 111a, and the fourth to sixth light emitting cells D1, D2, D3 may share a first conductivity type semiconductor layer 111b. Further, the seventh to ninth light emitting cells E1, E2, E3 may share a first conductivity type semiconductor layer 111c. The isolation trenches 115, 117 may be formed by an isolation process and a substrate 101 may be exposed through the isolation trenches 115, 117.

In addition, the first light emitting cell C1, the fourth light emitting cell D1, and the seventh light emitting cell E1 may be isolated from the second light emitting cell C2, the fifth light emitting cell D2 and the eighth light emitting cell E2, respectively, by a mesa etching process which forms a mesa trench 113a to expose the first conductivity type semiconductor layers 111a, 111b, 111c. Further, the second light emitting cell C2, the fifth light emitting cell D2, and the eighth light emitting cell E2 may be isolated from the third light emitting cell C3, the sixth light emitting cell D3, and the ninth light emitting cell E3, respectively, by a mesa etching process which forms a mesa trench 113b to expose the first conductivity type semiconductor layers 111a, 111b, 111c.

That is, the semiconductor stack 110 including the first conductivity type semiconductor layers 111a, 111b, 111c, an active layer 112 and a second conductivity type semiconductor layer 113 may be divided into the first to ninth light emitting cells C1, C2, C3, D1, D2, D3, E1, E2, E3 by the mesa trenches 113a, 113b and the isolation trenches 115, 117.

The first light emitting cell C1 and the third light emitting cell C3 may have a symmetrical shape with reference to an imaginary line connecting the first connection pad 520 to the second connection pad 430. The fourth to sixth light emitting cells D1, D2, D3 may have the same shape. In addition, the seventh light emitting cell E1 and the ninth light emitting cell E3 may have a symmetrical shape with reference to an imaginary line connecting the first connection pad 520 to the second connection pad 430.

Here, the second light emitting cell C2 in which the second connection pad 430 is formed and the eighth light emitting cell E2 related to formation of the first connection pad 520 have very significantly different shapes than other light emitting cells. The first connection pad 520 may be disposed adjacent to the fourth side surface 100d of the light emitting diode and the second connection pad 430 may be disposed adjacent to the second side surface 100b thereof so as to face the first connection pad 520.

The first connection pad 520 may be disposed on a mesa trench 113c. That is, for formation of the first connection pad 520, the mesa trench 113c may be formed by mesa etching a portion of a lower end of the eighth light emitting cell E2 near the fourth side surface 100d of the light emitting diode. Here, the mesa trench 113c may correspond to the exposed region 110a in the exemplary embodiments described above. The side surface of the semiconductor stack 110 may be exposed through the mesa trench 113c. The first connection pad 520 may be disposed in the mesa trench 113c to be electrically connected to the first conductivity type semiconductor layer 111c.

A first current blocking layer 540 may be disposed under the first connection pad 520. The first current blocking layer 540 may be disposed between the first connection pad 520 and the first conductivity type semiconductor layer 111c to allow efficient lateral spreading of electric current supplied to the first conductivity type semiconductor layer 111c. The first current blocking layer 540 (111c) may have a smaller area than the first connection pad 520. That is, a length and width of the first current blocking layer 540 is smaller than those of the first connection pad 520 such that the first current blocking layer 540 is placed in some region of the first connection pad 520. For example, the area of the first current blocking layer 540 may be 90% or less of the area of the first connection pad 520.

An insulation layer 565 may cover a side surface of the mesa trench 113c in which the first connection pad 520 is disposed. As shown in FIG. 15 and FIG. 16, the insulation layer 565 covers the side surface of the mesa trench 113c and may also be formed at a portion through which the lower extensions 520-1 pass so as to have a continuously connected curve shape. At the portion through which the lower extensions 520-1 pass, the insulation layer 565 may be first formed and the lower extensions 520-1 may be formed thereon.

In the first to sixth light emitting cells C1, C2, C3, D1, D2, D3, each of the lower extensions 520-1 may have one end electrically connected to a connection unit 520-2 disposed in each of the isolation trenches 115, 117 and may have the other end separated from the main upper extension 430-1b while being surrounded by the main upper extension 430-1b. Here, the insulation layer 151 extending from the second current blocking layer 150 may be disposed under the connection unit 520-2. The insulation layer 151 may cover the side surface of the semiconductor stack 110, which can be exposed through the isolation trenches 115, 117, to reduce or prevent the connection unit 520-2 from being connected to the side surface of the semiconductor stack 110, thereby improving reliability of the light emitting diode.

In the seventh and ninth light emitting cells E1, E3, each of the lower extensions 520-1 is connected to the first connection pad 520 and includes two linear regions connected to each other. The two linear regions may be parallel to the longitudinal direction and the transverse direction of the light emitting diode, respectively, and may be orthogonal to each other. The linear region formed in the longitudinal direction connects the linear region formed in the transverse direction to the first connection pad 520. As shown in FIG. 15, for formation of the lower extensions 520-1 (particularly, the linear regions in the longitudinal direction), some region of the seventh to ninth light emitting cells E1, E2, E3 near the fourth side surface 100d of the light emitting diode may be removed by mesa etching.

In the eighth light emitting cell E2, the lower extension 520-1 may have one end connected to the first connection pad 520 and may have the other end separated from the main upper extension 430-1b while being surrounded by the main upper extension 430-1b.

The second connection pad 430 may be formed on the second light emitting cell C2. The second current blocking layer 150 may be disposed under the second connection pad 430. Specifically, the second current blocking layer 150 may be interposed between the transparent electrode layer 160 and the second conductivity type semiconductor layer 113 under the second connection pad 430. The second current blocking layer 150 may have a greater width than the second connection pad 430. The transparent electrode layer 160 may be partially disposed under the second connection pad 430 and may include an opening 160a that exposes the second current blocking layer 150. The opening 160a may have a circular shape. As the opening 160a is formed on the transparent electrode layer 160, bonding strength of the second connection pad 430 can be improved.

On the other hand, the assistant upper extensions 430-1a and the main upper extensions 430-1b may be disposed on the transparent electrode layer 160. The assistant upper extensions 430-1a may electrically connect the main upper extensions 430-1b on the first to third light emitting cells C1, C2, C3. For example, referring to FIG. 15, the assistant upper extensions 430-1a may connect the upper extension 430-1b on the first light emitting cell C1 to the main upper extension 430-1b on the second light emitting cell C2. As a result, the first light emitting cell C1 may be electrically connected to the second light emitting cell C2.

In the fourth to ninth light emitting cells D1, D2, D3, E1, E2, E3, the assistant upper extensions 430-1a may connect the main upper extensions 430-1b to the lower extensions 520-1 of the first to third light emitting cells C1, C2, C3. The assistant upper extensions 430-1a may have a linear shape and may be disposed coaxially with the lower extensions 520-1. Each of the assistant upper extensions 430-1a may be connected at one end thereof to the main upper extension 430-1a and at the other end to the connection unit 520-2.

The main upper extensions 430-1b may be disposed to surround a distal end and a portion of a side surface of the lower extension 520-1. Accordingly, some portion of the main upper extension 430-1b may be disposed at one side of the lower extension 520-1 and the other portion of the main upper extension 430-1b may be disposed at the other side thereof facing the one side of the lower extension 520-1. The main upper extensions 430-1b may have a symmetrical shape with reference to an imaginary line extending from the lower extension 520-1.

In FIG. 15, the first, fourth and seventh light emitting cells C1, D1, E1 may be defined as a first group, the second, fifth and eighth light emitting cells C2, D2, E2 may be defined as a second group, and the third, sixth and ninth light emitting cells C3, D3, E3 may be defined as a third group. The light emitting cells in each group may be electrically connected in series through the assistant upper extensions 430-1a and the connection unit 520-2. In addition, the first group, the second group, and the third group may be electrically connected to one another in parallel through the assistant upper extensions 430-1a and the longitudinal linear regions of the lower extensions 520-1.

FIG. 16 shows an enlarged plan view illustrating the first connection pad 520, the first current blocking layer 540, and the lower extension 520-1. The following description will focus on these components with reference to FIG. 16.

First, the periphery of the first connection pad 520 may include linear regions and first curved regions 541. For example, referring to the plan view of the first connection pad 520 shown in FIG. 16, two first curved regions 541 are disposed to be symmetrical to each other with respect to the lower extension 520-1. The first curved regions 541 may be disposed adjacent to the side surface of the semiconductor stack 110 exposed during formation of the mesa trench 113c. Each of the first curved regions 541 has a radius of curvature of R1 and may be connected to the linear region.

The first current blocking layer 540 is interposed between the first connection pad 520 and the first conductivity type semiconductor layer 111c and the periphery of the first current blocking layer 540 may include linear regions and second curved regions 521. The second curved regions 521 may have a radius of curvature of $R_2$ and may be disposed inside the first curved regions 541. Here, $R_2$ is less than $R_1$. In addition, a gap between the first curved region 541 and the second curved region 521 may be kept uniform. Further, the gap G1 between the first curved region 541 and the second curved region 521 may be the same as a gap between the linear region of the first connection pad 520 and the linear region of the first current blocking layer 540. As a result, as defined by the first current blocking layer 540, a contact region between the first connection pad 520 and the first conductivity type semiconductor layer 111*c* may have a uniform width. In particular, the contact region between the first connection pad 520 and the first conductivity type semiconductor layer 111*c* may have a uniform width at a portion near the exposed semiconductor stack 110. With this structure, the light emitting diode allows uniform distribution of current supplied through the first connection pad 520.

Each of the lower extensions 520-1 may include a connecting portion 520-1*a* and a main extension 520-1*b*. The connecting portion 520-1*a* may connect the main extension 520-1*b* to the first connection pad 520. Referring to FIG. 16 showing a plan view of the connecting portion 520-1*a*, the periphery of the connecting portion 520-1*a* may include a third curved region 521-1. The third curved region 521-1 may have a radius of curvature of $R_3$.

As the connecting portion 520-1*a* includes the third curved region 521-1, the width G2 of the connecting portion 520-1*a* may decrease with increasing distance from the first connection pad 520. Here, the width G2 of the connecting portion 520-1*a* near the first connection pad 520 may be greater than the gap G1 between the first curved region 541 and the second curved region 521. As a result, a relatively large fraction of electric current supplied through the first connection pad 520 can be efficiently supplied to the connecting portion 520-1*a* having a relatively large area. Here, R3 may be less than $R_1$ and $R_2$.

The main extension 520-1*b* is connected at one end thereof to the connecting portion 520-1*a*. The width G3 of the main extension 520-1*b* may be greater than or equal to the gap G1 between the first curved region 541 and the second curved region 521.

Figure 17:
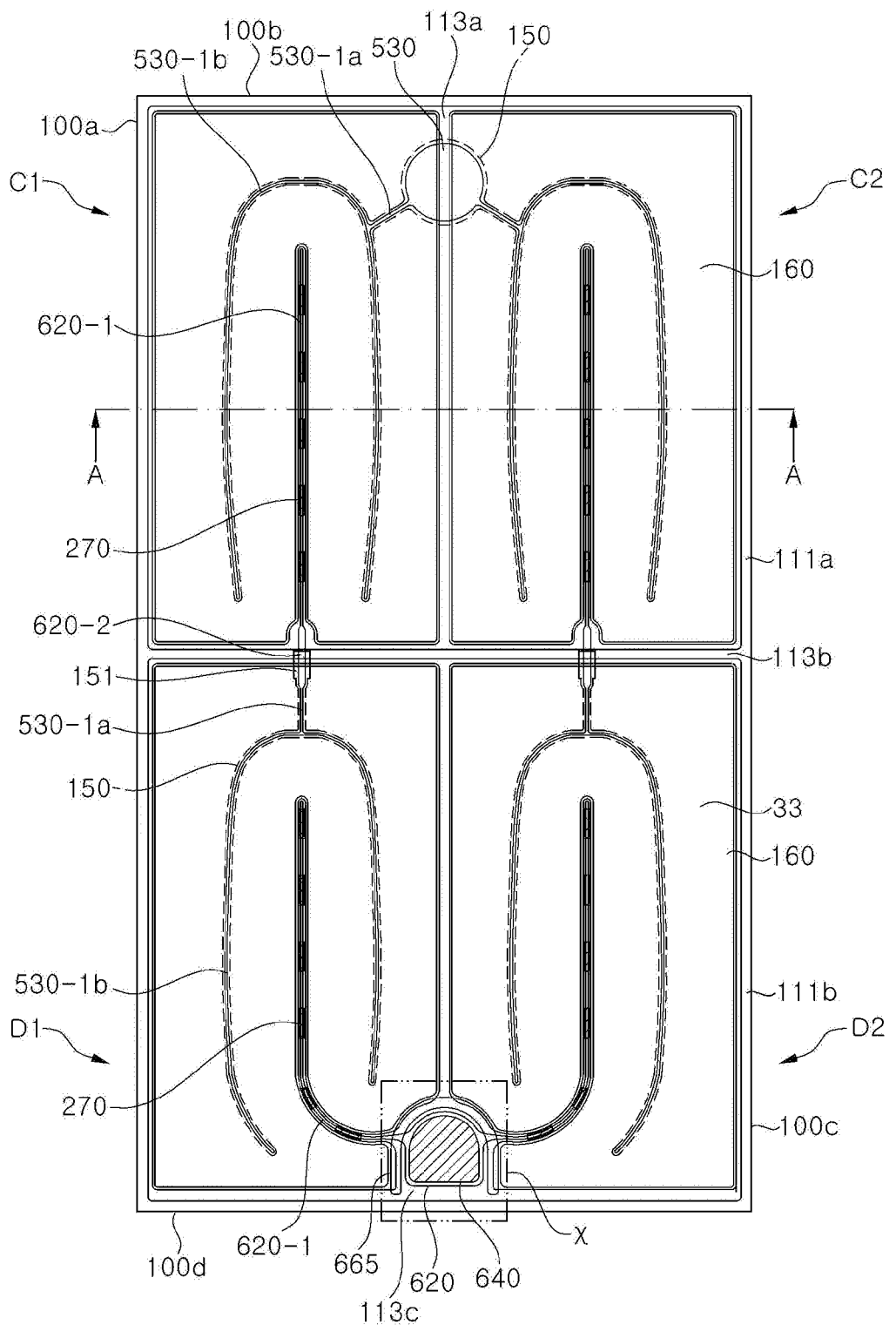
FIG. 17 and FIG. 18 show a light emitting diode according to yet another exemplary embodiment.
Figure 18:
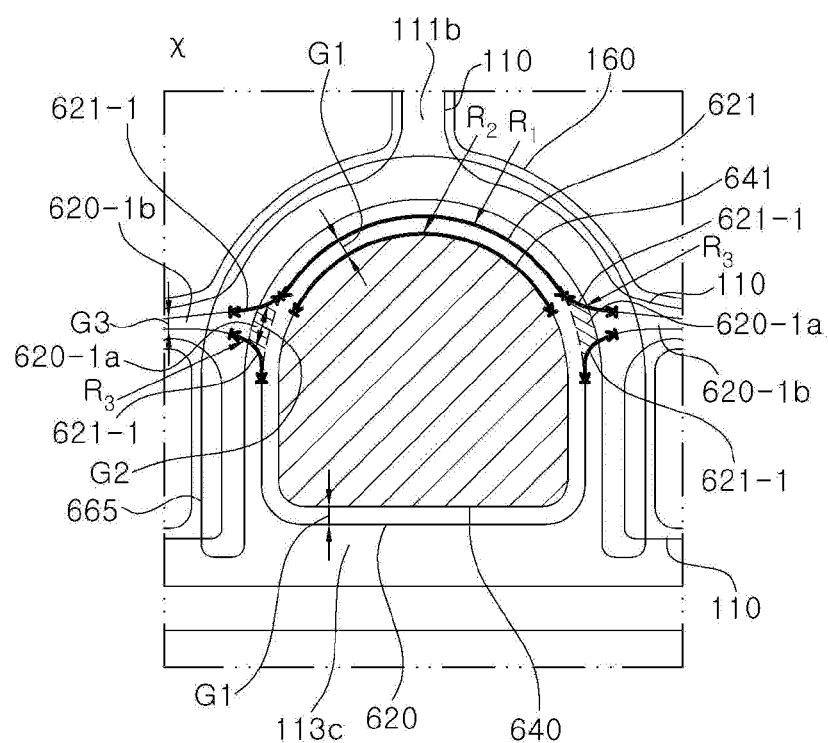

FIG. 17 and FIG. 18 are plan views of a light emitting diode according to yet another exemplary embodiment of the present disclosure. Specifically, FIG. 17 is a plan view of the light emitting diode according to this exemplary embodiment and FIG. 18 is an enlarged view of Region X of FIG. 17.

The light emitting diode according to this exemplary embodiment is substantially similar to the light emitting diode according to the above exemplary embodiment described with reference to FIG. 8 to FIG. 10 excluding the presence of a plurality of light emitting cells directly connected to each other and the shapes of a first connection pad 620, lower extensions 620-1, a first current blocking layer 640, a second connection pad 530, and upper extensions 530-1.

Referring to FIG. 17, the light emitting diode according to this exemplary embodiment may include first to fourth light emitting cell C1, C2, D1, D2. In addition, the light emitting diode includes a first connection pad 620, a second connection pad 530, upper extensions 530-1, and lower extensions 620-1. The upper extension 530-1 may be divided into an assistant upper extension 530-1 and a main upper extension 530-1.

The first to fourth light emitting cell C1, C2, D1, D2 may be isolated from each other through mesa trenches 113*a*, 113*b*, which expose first conductivity type semiconductor layers 111*a*, 111*b*. The first light emitting cell C1 and the third light emitting cell D1 may be symmetrical to the second light emitting cell C2 and the fourth light emitting cell D2 with reference to an imaginary line connecting the first connection pad 620 to the second connection pad 530, respectively.

The first connection pad 620 may be disposed adjacent to the fourth side surface 100*d* of the light emitting diode and the second connection pad 530 may be disposed adjacent to the second side surface 100*b* of the light emitting diode. As shown in FIG. 17, the first connection pad 620 and the second connection pad 530 may be disposed to face each other.

The first connection pad 620 may be disposed on a mesa trench 113*c*. That is, for formation of the first connection pad 620, the mesa trench 113*c* may be formed by mesa etching a portion of a lower end of each of the third light emitting cell D1 and the fourth light emitting cell D2 near the fourth side surface 100*d* of the light emitting diode. A side surface of the semiconductor stack 110 may be exposed through the mesa trench 113*c*. The first connection pad 620 may be disposed in the mesa trench 113*c* to be electrically connected to the first conductivity type semiconductor layer 111*c*. The first current blocking layer 640 may be interposed in some region between the first connection pad 620 and the first conductivity type semiconductor layer 111*b*, thereby enabling efficient lateral current spreading.

An insulation layer 665 may cover a side surface of the mesa trench 113*c* in which the first connection pad 620 is disposed. As shown in FIG. 15 and FIG. 16, the insulation layer 665 covers the side surface of the mesa trench 113*c* and may also be formed at a portion through which the lower extensions 620-1 pass so as to have a continuously connected curve shape.

In the first and second light emitting cells C1, C2, each of the lower extensions 620-1 may have one end electrically connected to a connection unit 620-2 disposed in the mesa trench 113*b* and may have the other end separated from the main upper extension 530-1*b* while being surrounded by the main upper extension 530-1*b*. Here, the insulation layer 151 extending from a second current blocking layer 150 may be disposed under the connection unit 620-2. The insulation layer 151 may cover the side surface of the semiconductor stack 110, which can be exposed through the mesa trench 113*b*, to reduce or prevent the connection unit 620-2 from being connected to the side surface of the semiconductor stack 110, thereby improving reliability of the light emitting diode.

In the third and fourth light emitting cells D1, D2, each of the lower extensions 620-1 is connected to the first connection pad 620 and includes a linear region and a curved region. The curved region may connect the linear region to the first connection pad 620. In the third and fourth light emitting cells D1, D2, the lower extensions 620-1 are symmetrical to each other with respect to an imaginary line connecting the first connection pad 620 and the second connection pad 530 to each other.

The second connection pad 530 may be disposed on the mesa trench 113*a* over the first light emitting cell C1 and the second light emitting cell C2. The second current blocking layer 150 having a greater width than the second connection pad 530 is disposed under the second connection pad 530. Accordingly, the second connection pad 530 may be prevented or reduced from being connected to the first conductivity type semiconductor layer 111*a* by the second current blocking layer 150 in the mesa trench 113*a*. A transparent electrode layer 160 may be interposed between the second connection pad 530 and the second current blocking layer 150, and the second connection pad 530 may be connected to the second conductivity type semiconductor layer 113 through the transparent electrode layer 160.

On the other hand, the assistant upper extensions 530-1*a* and the main upper extensions 530-1*b* may be disposed on the transparent electrode layer 160.

The assistant upper extensions 530-1*a* may connect the main upper extensions 530-1*b* to the second connection pad 530 on the first and the second light emitting cells C1, C2. As a result, the first light emitting cell C1 may be electrically connected to the second light emitting cell C2.

In the third and fourth light emitting cells D1, D2, the assistant upper extensions 530-1*a* may connect the main upper extensions 530-1*b* to the lower extensions 620-1 of the first and second light emitting cells C1, C2. In the third and fourth light emitting cells D1, D2, each of the assistant upper extensions 530-1*a* may be connected at one end thereof to the main upper extension 530-1*b* and at the other end thereof to the connection unit 620-2.

The main upper extension 530-1*b* may be disposed to surround a distal end and a portion of a side surface of the lower extension 620-1. Accordingly, some portion of the main upper extension 530-1*b* may be disposed at one side of the lower extension 620-1 and the other portion of the main upper extension 530-1*b* may be disposed at the other side thereof facing the one side of the lower extension 620-1.

FIG. 18 shows an enlarged plan view illustrating the first connection pad 620, the first current blocking layer 640, and the lower extension 620-1. The following description will focus on these components with reference to FIG. 18.

First, referring to a plan view of the first connection pad 620 shown in FIG. 18, the periphery of the first connection pad 620 may include linear regions and first curved regions 621. The first curved regions 621 may be disposed adjacent to the side surface of the semiconductor stack 110 exposed during formation of the mesa trench 113*c*. Each of the first curved regions 621 has a radius of curvature of $R_1$.

The first current blocking layer 640 is interposed between the first connection pad 620 and the first conductivity type semiconductor layer 111*b* and the periphery of the first current blocking layer 640 may include linear regions and second curved regions 641. The second curved regions 641 may have a radius of curvature of $R_2$ and may be disposed inside the first curved regions 621. That is, the second curved region 641 and the first curved region 621 have the same center, in which the second curved region 641 may be disposed inside a sector shape defined by the first curved region 621 and the center. Here, $R_2$ is less than $R_1$. In addition, a gap between the first curved region 621 and the second curved region 641 may be kept uniform. Further, the gap G1 between the first curved region 621 and the second curved region 641 may be the same as a gap between a linear region of the first connection pad 620 and a linear region of the first current blocking layer 640.

Each of the lower extensions 620-1 may include a connecting portion 620-1*a* and a main extension 620-1*b*. The connecting portion 620-1*a* may connect the main extension 620-1*b* to the first connection pad 420. An insulation layer 665 may be disposed under the connecting portion 620-1*a*. Referring to a plan view of the connecting portion 620-1*a* shown in FIG. 18, the periphery of the connecting portion 420-1*a* may include a third curved region 621-1. The third curved region 621-1 may have a radius of curvature of $R_3$.

As the connecting portion 620-1*a* includes the third curved region 621-1, a width G2 of the connecting portion 620-1*a* may decrease with increasing distance from the first connection pad 620. Here, the width G2 of the connecting portion 620-1*a* near the first connection pad 620 may be greater than the gap G1 between the first curved region 621 and the second curved region 641. As a result, a relatively large fraction of electric current supplied through the first connection pad 620 can be efficiently supplied to the connecting portion 620-1*a* having a relatively large area. Here, $R_3$ may be less than $R_1$ and $R_2$.

The main extension 620-1*b* is connected at one end thereof to the connecting portion 620-1*a*. A width G3 of the main extension 620-1*b* may be greater than or equal to the gap G1 between the first curved region 621 and the second curved region 641.

Figure 19:
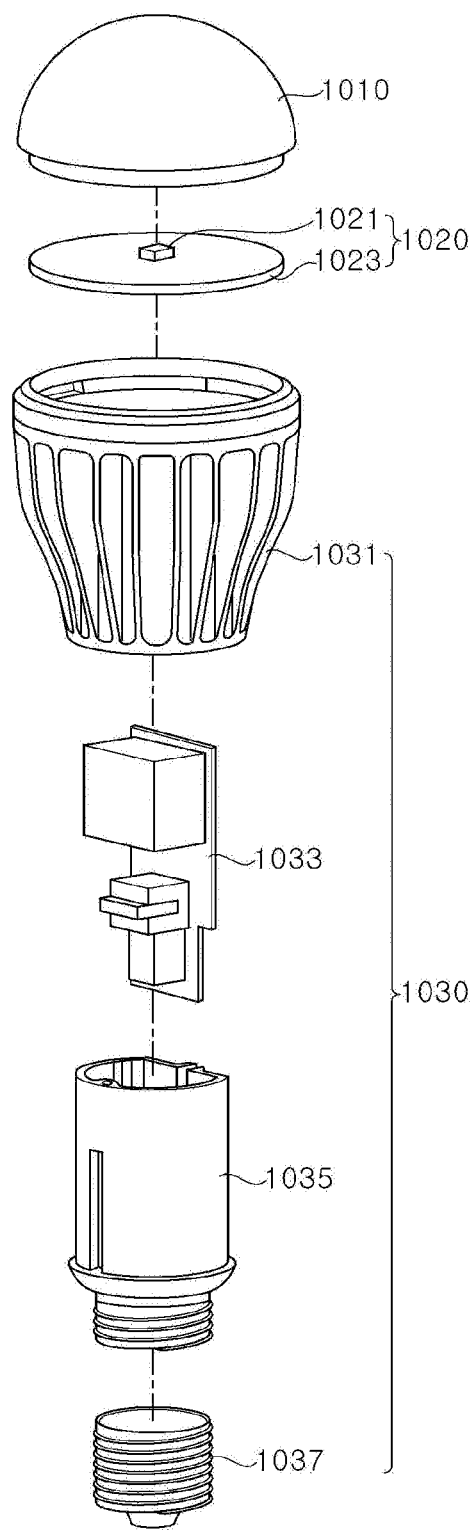
FIG. 19 is an exploded perspective view of a lighting apparatus to which a light emitting diode according to exemplary embodiments is applied.

FIG. 19 is an exploded perspective view of a lighting apparatus to which a light emitting diode according to exemplary embodiments of the present disclosure is applied.

Referring to FIG. 19, the lighting apparatus according to this exemplary embodiment includes a diffusive cover 1010, a light emitting diode module 1020, and a body 1030. The body 1030 may receive the light emitting diode module 1020 and the diffusive cover 1010 may be disposed on the body 1030 to cover an upper side of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connector 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033, and the power supply case 1035 having the power supply 1033 secured therein may be disposed within the body case 1031. The power source connector 1037 is disposed at a lower end of the power supply case 1035 and is coupled thereto. Accordingly, the power source connector 1037 is electrically connected to the power supply 1033 within the power supply case 1035 and can serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may be formed of a light transmitting material and light orientation of the lighting apparatus may be adjusted through regulation of the shape and optical transmissivity of the diffusive cover 1010. Thus, the diffusive cover 1010 may be modified to have various shapes depending on usage and applications of the lighting apparatus.

Figure 20:
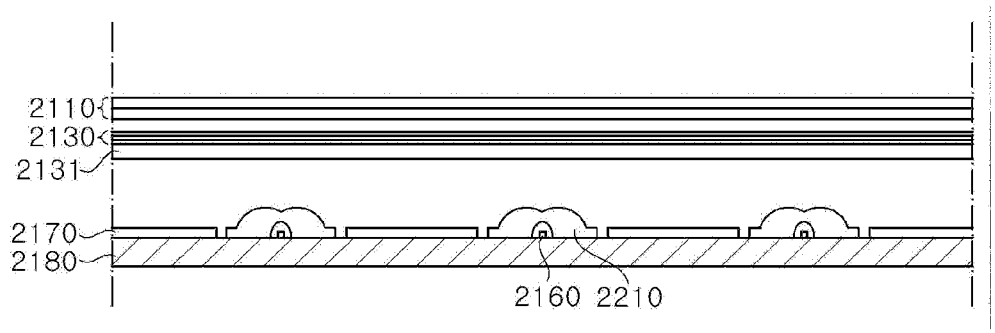
FIG. 20 is a cross-sectional view of one example of a display to which a light emitting diode according to exemplary embodiments is applied.

FIG. 20 is a cross-sectional view of one embodiment of a display apparatus to which a light emitting diode according to exemplary embodiments of the present disclosure is applied.

The display apparatus according to this exemplary embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one another, without being limited thereto. However, it should be understood that the backlight unit includes a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed above the light emitting diodes 2160. Light emitted from the light emitting diodes 2160 may be supplied in the form of sheet light to the display panel 2110 through the diffusive plate 2131 and the optical sheets 2130.

In this way, the light emitting diodes according to the exemplary embodiments may be applied to direct type displays like the display apparatus according to this exemplary embodiment.

Figure 21:
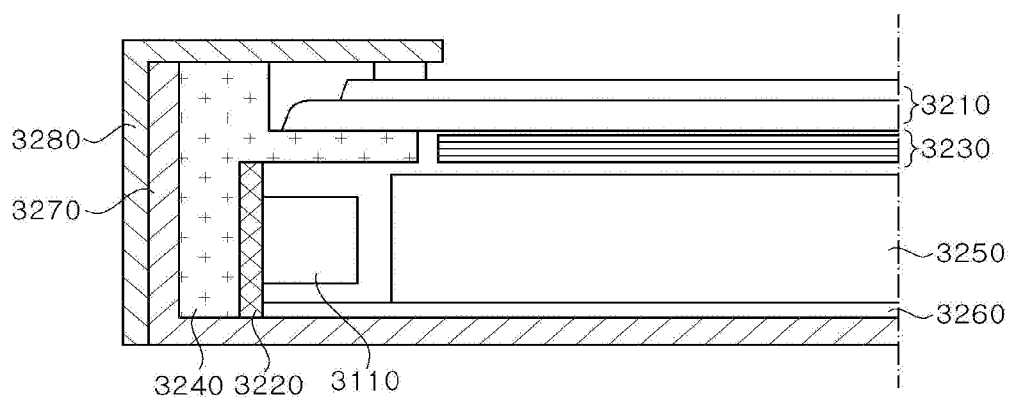
FIG. 21 is a cross-sectional view of another example of a display to which a light emitting diode according to exemplary embodiments is applied.

FIG. 21 is a cross-sectional view of another embodiment of the display apparatus to which a light emitting diode according to exemplary embodiments of the present disclosure is applied.

The display apparatus according to this exemplary embodiment includes a display panel 3210 on which an image is displayed, and a backlight unit disposed at a rear side of the display panel 3210 and emitting light thereto. Further, the display apparatus includes a frame 3240 supporting the display panel 3210 and receiving the backlight unit, and covers 3270, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the exemplary embodiments may be applied to edge type displays like the display apparatus according to this exemplary embodiment.

Figure 22:
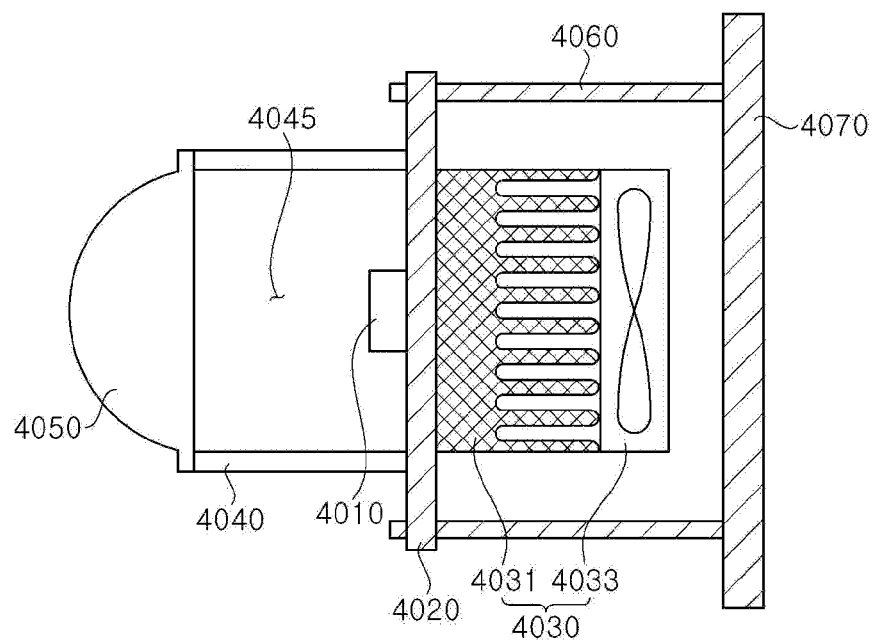
FIG. 22 is a cross-sectional view of a headlight to which a light emitting diode according to exemplary embodiments is applied.

FIG. 22 is a cross-sectional view of a headlight to which a light emitting diode according to exemplary embodiments of the present disclosure is applied.

Referring to FIG. 22, the headlight according to this exemplary embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be separated from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus can act as a light guide that provides a luminous path 4045. The connection member 4040 may be formed of a light reflective material or be coated therewith. On the other hand, the heat dissipation unit 4030 may include heat dissipation fins 4031 and/or a heat dissipation fan 4033 to dissipate heat generated upon operation of the light emitting diode 4010.

In this way, the light emitting diodes according to the exemplary embodiments may be applied to headlights, particularly, vehicular headlights, like the headlight according to this exemplary embodiment.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting diode comprising:
   a nitride semiconductor stack comprising a first conductivity type semiconductor layer, a second conductivity type semiconductor layer, and an active layer, the nitride semiconductor stack comprising an exposed region exposing the first conductivity type semiconductor layer;
   a first connection pad connected to the first conductivity type semiconductor layer through the exposed region and a lower extension extending from the first connection pad; and
   a first current blocking layer interposed between the first connection pad and the first conductivity type semiconductor layer,
   wherein the first connection pad comprises a first curved region having a radius of curvature of $R_1$,
   the first current blocking layer comprises a second curved region having a radius of curvature of $R_2$, the second curved region being disposed adjacent to an inner side of the first curved region, and
   the lower extension comprises a connecting portion adjoining the first connection pad and a main extension extending from the connecting portion, the connecting portion comprising a third curved region having a radius of curvature of $R_3$,
   wherein a width of the connecting portion of the lower extension is greater than a gap between the first curved region and the second curved region and gradually decreases with increasing distance from the first connection pad.

2. The light emitting diode of claim 1, wherein the radii of curvature of $R_1$, $R_2$ and $R_3$ satisfy a relationship of: $R_3 < R_2 < R_1$.

3. The light emitting diode of claim 1, wherein a gap between the first curved region and the second curved region is kept uniform.

4. The light emitting diode of claim 1, wherein the first curved region and the second curved region have the same center, and the second curved region is disposed within a region defined by the first curved region and imaginary straight lines connecting both ends of the first curved region to the center of the first and second curved regions.

5. The light emitting diode of claim 1, wherein a width of the main extension is greater than or equal to the gap between the first curved region and the second curved region.

6. The light emitting diode of claim 1, wherein the first current blocking layer is restrictively interposed in some region between the first conductivity type semiconductor layer and the first connection pad.

7. The light emitting diode of claim 6, wherein an area of the first current blocking layer does not exceed 90% of an area of a region between the first conductivity type semiconductor layer and the first connection pad.

8. The light emitting diode of claim 7, wherein the first current blocking layer comprises a single layer or a distributed Bragg reflector composed of multiple layers,
   the distributed Bragg reflector comprising a structure in which $SiO_2$ layers and $TiO_2$ layers are alternately stacked one above another, or in which $SiO_2$ layers and $Nb_2O_5$ layers are alternately stacked one above another.

9. The light emitting diode of claim 1, further comprising:
   a third current blocking layer disposed under the lower extension,
   the third current blocking layer comprising a plurality of dots separated from each other.

10. The light emitting diode of claim 9, wherein the third current blocking layer has a greater width than the main extension, and the main extension is connected to the first conductivity type semiconductor layer in a region between the plurality of dots.

11. The light emitting diode of claim 10, wherein the main extension is discontinuously connected to the first conductivity type semiconductor layer by the third current blocking layer.

12. The light emitting diode of claim 1, further comprising:
   a second connection pad disposed on the second conductivity type semiconductor layer; and
   an upper extension extending from the second connection pad.

13. The light emitting diode of claim 12, further comprising:
   an ohmic electrode layer disposed on the second conductivity type semiconductor layer and forming ohmic contact with the second conductivity type semiconductor layer,
   wherein the second connection pad and the upper extension are disposed on the ohmic electrode layer.

14. A light emitting diode comprising:
   a nitride semiconductor stack comprising a first conductivity type semiconductor layer, a second conductivity type semiconductor layer, and an active layer, the nitride semiconductor stack comprising an exposed region exposing the first conductivity type semiconductor layer;
   a first connection pad connected to the first conductivity type semiconductor layer through the exposed region and a lower extension extending from the first connection pad; and
   a first current blocking layer interposed between the first connection pad and the first conductivity type semiconductor layer,
   wherein:
   the first connection pad comprises a first curved region having a radius of curvature of $R_1$,
   the first current blocking layer comprises a second curved region having a radius of curvature of $R_2$, the second curved region being disposed adjacent to an inner side of the first curved region,
   the lower extension comprises a connecting portion adjoining the first connection pad and a main extension extending from the connecting portion, the connecting portion comprising a third curved region having a radius of curvature of $R_3$, the first connection pad covers a side of the first current blocking layer, and a portion of the first connection pad between an inner side of the first curved region and an outer side of the second curved region contacts the first conductivity type semiconductor layer.

15. The light emitting diode of claim 14, wherein the radii of curvature of $R_1$, $R_2$ and $R_3$ satisfy a relationship of: $R_3<R_2<R_1$.

16. The light emitting diode of claim 14, wherein a gap between the first curved region and the second curved region is kept uniform.

17. The light emitting diode of claim 14, wherein the first curved region and the second curved region have the same center, and the second curved region is disposed within a region defined by the first curved region and imaginary straight lines connecting both ends of the first curved region to the center of the first and second curved regions.

18. The light emitting diode of claim 14, wherein the first current blocking layer is restrictively interposed in some region between the first conductivity type semiconductor layer and the first connection pad.

19. The light emitting diode of claim 18, wherein an area of the first current blocking layer does not exceed 90% of an area of a region between the first conductivity type semiconductor layer and the first connection pad.

20. The light emitting diode of claim 19, wherein the first current blocking layer comprises a single layer or a distributed Bragg reflector composed of multiple layers, the distributed Bragg reflector comprising a structure in which $SiO_2$ layers and $TiO_2$ layers are alternately stacked one above another, or in which $SiO_2$ layers and $Nb_2O_5$ layers are alternately stacked one above another.

* * * * *